United States Patent
Al-Absi

(10) Patent No.: US 12,451,850 B1
(45) Date of Patent: Oct. 21, 2025

(54) SHADOW RESISTANCE-TO-FREQUENCY AND RESISTANCE-TO-TIME CONVERTER

(71) Applicant: King Fahd University of Petroleum and Minerals, Dhahran (SA)

(72) Inventor: Muneer A. Al-Absi, Dhahran (SA)

(73) Assignee: King Fahd University of Petroleum and Minerals, Dhahran (SA)

( * ) Notice: Subject to any disclaimer, the term of this patent is extended or adjusted under 35 U.S.C. 154(b) by 0 days.

(21) Appl. No.: 19/237,948

(22) Filed: Jun. 13, 2025

(51) Int. Cl.
*H03F 3/45* (2006.01)
*G04F 10/00* (2006.01)

(52) U.S. Cl.
CPC .................. *H03F 3/4508* (2013.01)

(58) Field of Classification Search
CPC .............. H03F 3/4508; G04F 10/00
USPC ................... 330/252–261
See application file for complete search history.

(56) References Cited

U.S. PATENT DOCUMENTS

| | | | | |
|---|---|---|---|---|
| 4,296,413 | A * | 10/1981 | Milkovic | G08C 19/26 340/870.42 |
| 9,989,927 | B1 * | 6/2018 | Caffee | G01K 7/01 |
| 2010/0001803 | A1 | 1/2010 | Ramírez Muñoz | |

OTHER PUBLICATIONS

S. Kaliyugavaradan, "A linear resistance-to-time converter with high resolution", IEEE Transactions on Instrumentation and Measurement, vol. 49, Issue: 1, Feb. 2000, pp. 151-153. (Abstract Only).

Raj Senani, "Linear resistance-to-frequency conversion employing integrated circuit operation amplifiers", International Journal of Electronics, vol. 50, Issue 6, 1981, pp. 485-491.

(Continued)

*Primary Examiner* — Hieu P Nguyen
(74) *Attorney, Agent, or Firm* — Oblon, McClelland, Maier & Neustadt, L.L.P.

(57) ABSTRACT

A resistance-to-frequency, resistance-to-time converter including a first CFOA having an inverting input $X_1$, a non-inverting input $Y_1$ connected to an internal output $Z_1$, an internal output $W_1$ and an external output $V_0$; a second CFOA having an inverting input $X_2$ connected to resistor $R_3$, a non-inverting input $Y_2$ connected to resistor $R_2$ and the $Y_1$, an internal output $Z_2$ connected to a capacitor C, an internal output $W_2$ and an external output $V_{tr}$; a third CFOA having an inverting input $X_3$ connected to a variable resistor $R_T$, a non-inverting input $Y_3$ connected to the $V_{tr}$, an internal output $Z_3$ connected to a variable resistor $R_F$, an internal output $W_3$ and an external output $V_1$ connected by a resistor $R_1$ to the $X_1$. Each CFOA is voltage saturated. The $V_0$ is a square wave with period T proportional to $R_T/R_F$ and a frequency of oscillation f proportional to $R_F/R_T$.

20 Claims, 12 Drawing Sheets

(56) References Cited

OTHER PUBLICATIONS

D. Ramírez Muñoz, et al., "Note: Direct sensor resistance-to-frequency conversion with generalized impedance converter", Review of scientific instruments, vol. 81, Issue 12, Dec. 2010, pp. 1-9.
Analog Devices, "60 MHZ, 2000 V/µs, Monolithic Op Amp with Quad Low Noise", Data Sheet AD844, 1989-2017, www.analog.com, pp. 1-20.

* cited by examiner

SHADOW RESISTANCE-TO-FREQUENCY AND RESISTANCE-TO-TIME CONVERTER

STATEMENT REGARDING PRIOR DISCLOSURE BY THE INVENTORS

Aspects of this technology are described in an article "A Novel Compact and Shadow Resistance-to-Frequency and Resistance-to-Time Converter" published in the International Journal of Circuit Theory and Applications, Vol. 53(2), (2024), which is incorporated herein by reference in its entirety.

STATEMENT OF ACKNOWLEDGEMENT

Support provided by the Deanship of Research Oversight and Coordination at King Fahd University of Petroleum & Minerals (KFUPM) Dhahran, Saudi Arabia is gratefully acknowledged.

BACKGROUND

Technical Field

The present disclosure is directed to analog signal processing circuits and, more particularly to, resistance-to-frequency and resistance-to-time conversion circuits implemented using current feedback operational amplifiers (CFOAs).

Description of Related Art

The "background" description provided herein is for the purpose of generally presenting the context of the disclosure. Work of the presently named inventors, to the extent it is described in this background section, as well as aspects of the description which may not otherwise qualify as prior art at the time of filing, are neither expressly or impliedly admitted as prior art against the present invention.

Resistive sensors have become integral to various industrial and scientific applications due to their ability to detect physical and chemical magnitudes, control industrial processes, and enhance measurement and instrumentation systems. These sensors convert changes in resistance into measurable electrical signals, providing valuable real-time data for system monitoring, decision-making, and control. With advancements in materials science, fabrication techniques, and signal processing techniques, the performance of the resistive sensors continues to improve, offering greater sensitivity, precision, and versatility. As technology continues to evolve, the applications of the resistive sensors are expanding, necessitating the development of efficient converters to handle large resistance variations in a variety of contexts.

Several techniques have been proposed to convert the resistance variation into a frequency or time signal for easier processing and analysis. These techniques include resistance-to-frequency and resistance-to-time converters, which are essential in situations where large resistance changes need to be measured accurately. Such converters are designed to handle varying resistance values and convert them into time or frequency-based signals, which can be easily analyzed and utilized in practical applications.

In one approach, an off-the-shelf circuit for resistance-to-frequency conversion has been described, which is simple but lacks precision and performance in demanding applications (e.g., industrial automation, environmental monitoring, and the like). (See: Al-Absi, M. A., "*A new shadow resistance to frequency converter as a read-out circuit for resistive sensors*," Int J Circ Theor Appl., 2024, 1-8).

In another approach, a relaxation oscillator-based active bridge circuit for linear resistance-to-frequency conversion has been described (See: Islam, T., Kumar, L., Uddin, Z., & Ganguly, A., "*Relaxation Oscillator-Based Active Bridge Circuit for Linearly Converting Resistance to Frequency of Resistive Sensor*," IEEE Sensors Journal, vol. 13, no. 5, pp. 1507-1513, May 2013). However, this circuit involves a complex design with nine operational amplifiers and numerous passive components.

In yet another approach, an Arduino-based resistance-to-time converter to enhance the resistive sensitivity of embedded systems has been described (See: Hunasekattte, D., "*A Resistance-to-time Converter to Enhance Resistive Sensitivity of Embedded Systems,*" 2020 4th International Conference on Electronics, Communication and Aerospace Technology (ICECA), Coimbatore, India, 2020, pp. 210-215). Although the approach is cost-effective and simple, however, the approach offers limited precision and is unsuitable for applications requiring high-resolution or highly accurate sensor measurements.

A resistance-to-time converter with switching impulse calibrators for resistive bridge sensors has been described (See: Zahangir, M., Khan, S., Adam, I., Kadir, K. A., Nordin, A. N., & Ibrahim, S. N., "*A Proposed Resistance-to-Time Converter with Switching Impulse Calibrators for Resistive Bridge Sensors,*" 2017 IEEE 4th International Conference on Smart Instrumentation, Measurement and Application (ICSIMA), Putrajaya, Malaysia, 2017, pp. 1-3). This converter provides an approach to time conversion, but the design of the converter involves increased circuit complexity and presents integration difficulties when scaled for use in larger or more diverse sensor systems.

In yet another approach, a microcontroller interface for the resistive sensors using a resistance-to-time converter has been described (See: Anandanatarajan, R., Mangalanathan, U., & Gandhi, U., "*Enhanced Microcontroller Interface of Resistive Sensors Through Resistance-to-Time Converter*," IEEE Transactions on Instrumentation and Measurement, vol. 69, no. 6, pp. 2698-2706, June 2020). Although this approach improves sensor interfacing, it is not optimal for high-speed or high-accuracy applications.

In another conventional approach, a microcontroller-based readout system for the resistive sensors has been described that offers a cost-effective solution (See: Simid, M., "*Microcontroller-Based Readout of Resistive Sensors*," IFAC-PapersOnLine, vol. 55, no. 4, 2022, pp. 242-247). However, the microcontroller-based design is limited by processing speed and scalability for complex applications.

In yet another approach, a circuit has been described that focuses on reducing measurement time in direct interface circuits for resistive sensor readout (See: Hidalgo-Lopez, J. A., et al., "*Reducing Measurement Time in Direct Interface Circuits for Resistive Sensor Readout*," Sensors (Basel, Switzerland), vol. 20, no. 9, 2020, p. 2596). While this approach improves efficiency, it does not fully address accuracy requirements in high-precision environments.

Two methods have been described to simplify the resistive sensor readout through a resistance-to-time-to-digital conversion (See: Hidalgo-López, J. A., & Castellanos-Ramos, J., "*Two Proposals to Simplify Resistive Sensor Readout Based on Resistance-to-Time-to-Digital Conversion*," Measurement: Journal of the International Measurement Confederation, vol. 213, no. 112728, 2023, p. 112728).

Although the methods simplify the design, they lack the flexibility or robustness needed for compatibility with a wide range of sensor types.

The reference titled "*Direct sensor resistance-to-frequency conversion with generalized impedance converter*" (See: Munoz et al., published in Review of Scientific Instruments, 81, 126101 on Dec. 3, 2010) describes a resistance-to-frequency converter used in a temperature monitoring circuit, incorporating an a stable multivibrator and two amplifiers. However, the circuit structure of the converter is complex and presents limitations in terms of linearity, component count, and adaptability for broader sensing applications.

US20100001803A1 describes a resistive sensor circuit that produces an output frequency directly proportional to the resistance of the sensor. The circuit incorporates two operational amplifiers, which enable direct resistance-to-frequency conversion, providing an oscillating electrical signal that reflects the resistance value of the sensor. The design of the circuit is based on voltage-mode operational amplifiers and follows a frequency-based conversion scheme. The approach focuses on frequency domain output with a simpler amplifier setup, which limits adaptability for time-domain applications or advanced current feedback operational amplifier (CFOA)-based designs.

Each of the aforementioned references focused on various resistive sensor interface techniques, including resistance-to-frequency and resistance-to-time conversion techniques. While these techniques provided foundational designs, they often prioritized simplicity, low cost, or specific readout mechanisms using operational amplifiers, switched capacitor techniques, or microcontroller-based platforms. Many of these techniques involved conventional op-amps or microcontroller circuits, with some featuring complex architecture, numerous passive components, or limited adaptability across different sensor applications. Additionally, some designs emphasized frequency-domain outputs or relied on digital conversion steps, which introduced limitations in precision, scalability, or circuit flexibility.

Accordingly, it is one object of the present disclosure to provide a resistance-to-frequency and resistance-to-time converter utilizing CFOAs arranged in a specific feedback configuration, thereby improving linearity, simplifying circuit design, reducing component count, and enhancing adaptability. This configuration offers a more efficient and versatile interface solution for precise resistive sensor readout across various applications.

SUMMARY

In an exemplary embodiment, a resistance-to-frequency, resistance-to-time converter is described. The resistance-to-frequency, resistance-to-time converter includes a first current feedback operational amplifier (CFOA) having an inverting input $X_1$, a non-inverting input $Y_1$, an internal output $Z_1$, an internal output $W_1$ and an external output $V_0$. The non-inverting input $Y_1$ is connected to the internal output $Z_1$. The resistance-to-frequency, resistance-to-time converter further includes a second CFOA having an inverting input $X_2$, a non-inverting input $Y_2$, an internal output $Z_2$, an internal output $W_2$ and an external output $V_{tr}$. The non-inverting input $Y_2$ is connected to a resistor $R_2$, and to the non-inverting input $Y_1$, the inverting input $X_2$ is connected to a resistor $R_3$, and the internal output $Z_2$ is connected to a capacitor C. The resistor $R_2$, the resistor $R_3$ and the capacitor C are connected to a ground terminal. The resistance-to-frequency, resistance-to-time converter further includes a third CFOA having an inverting input $X_3$, a non-inverting input $Y_3$, an internal output $Z_3$, an internal output $W_3$ and an external output $V_1$. The external output $V_1$ is connected by a resistor $R_1$ to the inverting input $X_1$. The inverting input $X_3$ is connected to a variable resistor $R_T$. The internal output $Z_3$ is connected to a variable resistor $R_F$. The non-inverting input $Y_3$ is connected to the external output $V_{tr}$. Each CFOA is voltage saturated. The external output $V_0$ is a square wave with positive amplitude $V_{SAT+}$ and negative amplitude $V_{SAT-}$. The external output $V_0$ has a period T proportional to a ratio of a magnitude of the variable resistor $R_T$ to a magnitude of the variable resistor $R_F$. The external output $V_0$ has a frequency of oscillation f proportional to a ratio of the magnitude of the variable resistor $R_F$ to the magnitude of the variable resistor $R_T$.

In another exemplary embodiment, a method for assembling a resistance-to-frequency, resistance-to-time converter is described. The method includes connecting a non-inverting input $Y_1$ to an internal output $Z_1$ of a first current feedback operational amplifier (CFOA). The first CFOA has an inverting input $X_1$, an internal output $W_1$ and an external output $V_0$. The method further includes connecting a resistor $R_2$ between a ground terminal and the non-inverting input $Y_1$. The method further includes connecting the resistor $R_2$ to a non-inverting input $Y_2$ of a second CFOA. The second CFOA has an inverting input $X_2$, an internal output $Z_2$, an internal output $W_2$ and an external output $V_{tr}$. The method further includes connecting the resistor $R_2$ between the ground terminal and the non-inverting input $Y_2$. The method further includes connecting a resistor $R_3$ between the ground terminal and the inverting input $X_2$. The method further includes connecting a capacitor C between the ground terminal and the internal output $Z_2$. The method further includes connecting the external output $V_{tr}$ to a non-inverting input $Y_3$ of a third CFOA having an inverting input $X_3$, an internal output $Z_3$, an internal output $W_3$ and an external output $V_1$. The method further includes connecting a resistor $R_1$ between the external output $V_1$ and the inverting input $X_1$. The method further includes connecting a variable resistor $R_T$ between the ground terminal and the inverting input $X_3$. The method further includes connecting a variable resistor $R_F$ between the ground terminal and the internal output $Z_3$. The method further includes connecting a positive DC voltage to a positive bias terminal of each CFOA. The method further includes connecting a negative DC voltage to a negative bias terminal of each CFOA.

In yet another exemplary embodiment, a method of operating a resistance-to-frequency, resistance-to-time converter is described. The method includes generating a square wave having a positive amplitude $V_{SAT+}$ and a negative amplitude $V_{SAT-}$ at an external output $V_0$ of a circuit. The circuit includes a first current feedback operational amplifier (CFOA) having an inverting input $X_1$, a non-inverting input $Y_1$, an internal output $Z_1$, an internal output $W_1$ and the external output $V_0$. The non-inverting input $Y_1$ is connected to the internal output $Z_1$. The circuit further includes a second CFOA having an inverting input $X_2$, a non-inverting input $Y_2$, an internal output $Z_2$, an internal output $W_2$ and an external output $V_{tr}$. The non-inverting input $Y_2$ is connected to a resistor $R_2$, and to the non-inverting input $Y_1$, the inverting input $X_2$ is connected to a resistor $R_3$, and the internal output $Z_2$ is connected to a capacitor C. The resistor $R_2$, the resistor $R_3$ and the capacitor C are connected to a ground terminal. The circuit further includes a third CFOA having an inverting input $X_3$, a non-inverting input $Y_3$, an internal output $Z_3$, an internal output $W_3$ and an external output $V_1$. The external output $V_1$ is connected by a resistor $R_1$ to the inverting input $X_1$. The inverting input $X_3$ is connected to a variable resistor $R_T$. The internal output $Z_3$ is connected to a variable resistor $R_F$. The non-inverting input $Y_3$ is connected to the external output $V_{tr}$. The non-inverting input $Y_3$ is connected to the external output $V_{tr}$.

The method further includes voltage saturating each CFOA. The method further includes selecting a period T of the square wave by varying a magnitude of the variable resistor $R_T$ and a magnitude of the variable resistor $R_F$. The method further includes selecting a frequency of oscillation f of the square wave by varying the magnitude of the variable resistor $R_F$ and the magnitude of the variable resistor $R_T$.

The foregoing general description of the illustrative embodiments and the following detailed description thereof are merely exemplary aspects of the teachings of this disclosure and are not restrictive.

BRIEF DESCRIPTION OF THE DRAWINGS

A more complete appreciation of this disclosure and many of the attendant advantages thereof will be readily obtained as the same becomes better understood by reference to the following detailed description when considered in connection with the accompanying drawings, wherein.

DETAILED DESCRIPTION

Figure 1A:
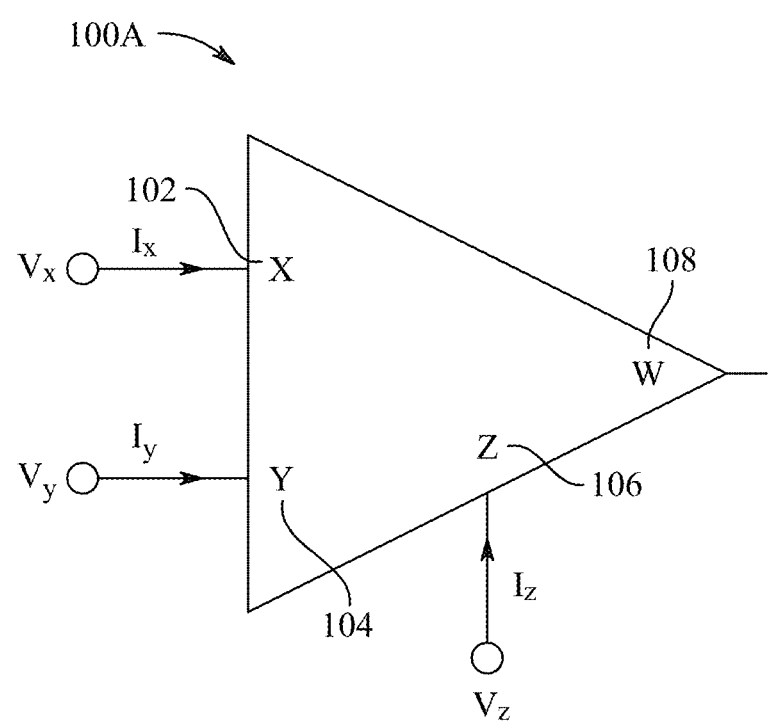
FIG. 1A illustrates an exemplary symbolic representation of a current feedback operational amplifier (CFOA), according to certain embodiments.

In the drawings, like reference numerals designate identical or corresponding parts throughout the several views. Further, as used herein, the words "a", "an" and the like generally carry a meaning of "one or more", unless stated otherwise.

Furthermore, the terms "approximately," "approximate", "about" and similar terms generally refer to ranges that include the identified value within a margin of 20%, 10%, or preferably 5%, and any values therebetween.

Aspects of the present disclosure are directed to a resistance-to-frequency and resistance-to-time converter that utilizes current feedback operational amplifiers (CFOAs) in a specific feedback configuration to improve linearity, simplify a circuit structure, reduce component count, and enhance adaptability for precise resistive sensor readout. Conventional resistance-to-frequency and resistance-to-time converters often face challenges in achieving a balance between precision, simplicity, and circuit complexity, especially when handling a wide range of sensor types and application requirements.

The present disclosure describes a converter architecture that employs three CFOAs working in coordination to enable precise resistance-to-frequency and resistance-to-time conversion. By utilizing specific ratios of variable resistors and a capacitor, the converter architecture enables accurate tuning of the oscillation frequency and the period. The converter architecture generates a square wave as a primary output and a triangular wave as an intermediate signal, facilitating reliable signal representation of the sensed resistance. By operating in a voltage-saturated mode with symmetric direct current (DC) biasing, the converter ensures stable, linear, and reliable performance. This converter architecture achieves precision while reducing circuit complexity and enhancing adaptability across different resistive sensor applications.

FIG. 1A illustrates an exemplary symbolic representation of a current feedback operational amplifier (CFOA) 100A. The CFOA 100A is an active analog component that differs from voltage-feedback operational amplifiers (VFOAs) by offering a high slew rate and wide bandwidth that are independent of closed-loop gain. As used herein, the term "closed-loop gain" refers to a ratio of an output signal to an input signal of an amplifier (i.e., CFOA 100A) when a feedback network is connected. The feedback network, such as resistors and/or capacitors, stabilizes the gain and determines a frequency response of a system that includes the CFOA 100A and external components (i.e., feedback network). As used herein, the term "high slew rate" refers to an ability of the amplifier to rapidly change a corresponding output voltage in response to a sudden change in input voltage, measured in volts per microsecond (V/μs). The high slew rate enables fast signal transitions, which is critical for generating sharp square waves and for high-speed analog signal processing. Also, as used herein, the term "wide bandwidth" refers to a range of frequencies over which the amplifier operates effectively without significant loss in the gain or signal distortion.

The CFOA 100A includes four functional terminals, such as an inverting input X 102, a non-inverting input Y 104, an internal output Z 106, and an internal output W 108. The inverting input X 102 is configured to receive feedback current (i.e., current input signal) derived from an output of the CFOA 100A through the feedback network. In an aspect, the feedback current may be obtained from negative feedback, enabling the inverting input X 102 to operate as a control node that regulates the behavior of the CFOA 100A. As used herein, the term "negative feedback" refers to a process of returning a portion of an output of the amplifier to corresponding input in opposition to the input signal, thereby stabilizing the performance of the CFOA 100A and improving parameters, such as but not limited to, linearity, bandwidth, accuracy, and the like. In an aspect, the inverting input X 102 may be electrically coupled to the internal output Z 106 of the CFOA 100A through the feedback network, which controls the flow of the feedback current. This configuration facilitates a stable operation of the CFOA 100A by regulating the gain and dynamic response of the CFOA 100A based on the negative feedback.

The non-inverting input Y 104 of the CFOA 100A functions as a high-impedance voltage input terminal and serves as a reference point for an applied input voltage signal. Due to the high input impedance of the non-inverting input Y 104, the non-inverting input Y 104 draws negligible current, thereby minimizing loading effects on a preceding stage and preserving signal integrity. This characteristic makes the non-inverting input Y 104 suitable for direct connection to a wide range of external voltage sources, such as, but not limited to, a constant direct current (DC) supply, a time-varying signal generator, an output of a sensor or preceding analog or mixed-signal circuit block, and the like, to receive the input voltage signal. In operation, the input voltage signal applied at the non-inverting input Y 104 is replicated at a low impedance inverting input X 102 through a unity gain buffer, enabling precise voltage tracking and control. As used herein, the term "unity-gain buffer" refers to a circuit configuration in which the output voltage equals the input voltage (i.e., a gain of one), characterized by the high input impedance and low output impedance. In the context of the CFOA 100A, the unit-gain buffer ensures that the voltage at the inverting input X 102 closely follows the voltage at the non-inverting input Y 104 without drawing significant current from the non-inverting input Y 104, thereby maintaining voltage integrity and supporting stable feedback operation.

The internal output Z 106 functions as a current output node of the CFOA 100A. The internal output Z 106 is connected to an output of an internal current mirror that replicates the current input signal received at the inverting input X 102. In an aspect, the internal output Z 106 may perform a current-mode feedback operation, allowing external circuits to route the current input signal into an internal transimpedance node or a voltage buffer stage for further signal processing. In a standard CFOA topology, the current input signal at the internal output Z 106 is subsequently converted into a voltage signal at the internal transimpedance node (shown in FIG. 1B) and then delivered to the internal output W 108 as a final output voltage.

The internal output W 108 is configured to deliver a low-impedance output voltage signal, which reflects the voltage developed at the internal transimpedance node within the CFOA 100A. In an aspect, the output voltage signal at the internal output W 108 may be supplied to subsequent circuit stages, such as the feedback networks or load configurations, with minimal signal degradation due to the low output impedance. In another aspect, the internal output W 108 may be used in combination with external resistors or other passive components to develop the output voltage signal corresponding to the current input signal conveyed from the inverting input X 102. In an aspect, the internal output W 108 may substantially influence the operational characteristics of circuits in which the CFOA 100A is implemented. The operational characteristics, such as gain, bandwidth, and output impedance, may be influenced by the configuration and values of components connected to the internal output W 108.

In an aspect, the internal output W 108 may be connected to a resistor (or other passive components i.e. capacitors or inductors) to convert the current input signal into the corresponding output voltage signal. The conversion is based on Ohm's Law, which states that:

$$\text{Voltage } (V) = \text{Current } (I) * \text{Resistance } (R) \tag{1}$$

For example, if the internal output Z 106 of the CFOA 100A outputs the current (I), the resistor (R) is placed between the internal output W 108 and a ground terminal (not shown). The voltage (V) at the internal output W 108 is $V = I \times R$.

When a small current $I_X$ is applied to the inverting input X 102 of the CFOA 100A, the CFOA 100A amplifies this current $I_X$, producing a larger current $I_Z$ at the internal output Z 106. While performing a current-to-voltage conversion, the amplified current $I_Z$ at the internal output Z 106 flows through a resistor R (not shown) connected between the internal output W 108 and the ground terminal. The current $I_Z$ delivered through the resistor R develops a voltage across the resistor R, forming the overall output voltage $V_W$ (not shown) at the internal output W 108 of the CFOA 100A. For instance, if the CFOA 100A generates the amplified current of 1 milliampere (mA) at the internal output Z 106 and the resistor R=1 Kilo ohm (kΩ), the resulting output voltage $V_W$ at the internal output W 108 is:

$$V_W = I_Z * R = 1 \text{ mA} * 1 \text{ k}\Omega = 1 V.$$

In this case, the resistor R directly determines the output voltage $V_W$, and changing the resistor R may change both the gain and the output impedance. The internal output W 108 provides the output voltage signal (1V in this case) that may be used by the external circuits, such as an analog-to-digital converter (ADC), or to drive voltage-driven circuits. Accordingly, the internal output W 108 serves as a critical node in CFOA-based analog signal processing circuits.

In an aspect, the CFOA 100A may be implemented using a commercially available integrated circuit, such as AD844. In such a configuration, the CFOA 100A exhibits idealized behavior characterized by the following relationships: the voltage at the inverting input X 102 is equal to the voltage at the non-inverting input Y 104, expressed as $V_x = V_y$; the current entering the inverting input X 102 is mirrored at the internal output Z 106, such that: $I_x = I_z$; and the current entering the non-inverting input Y 104 is approximately zero, i.e. $I_y = 0$.

These behavioral characteristics form the basis for understanding the operation of CFOA-based circuits and are applicable in both standalone amplifier configurations and more complex configurations, including oscillators, filters, waveform converters, and the like. The internal structure of the CFOA 100A produces faster and more linear response characteristics than the conventional VFOAs, making the CFOA 100A suitable for high-speed and precision analog signal processing. In many applications, the CFOA 100A is preferred over the VFOAs due to its ability to maintain stable operation with capacitive loads and improved frequency response.

Figure 1B:
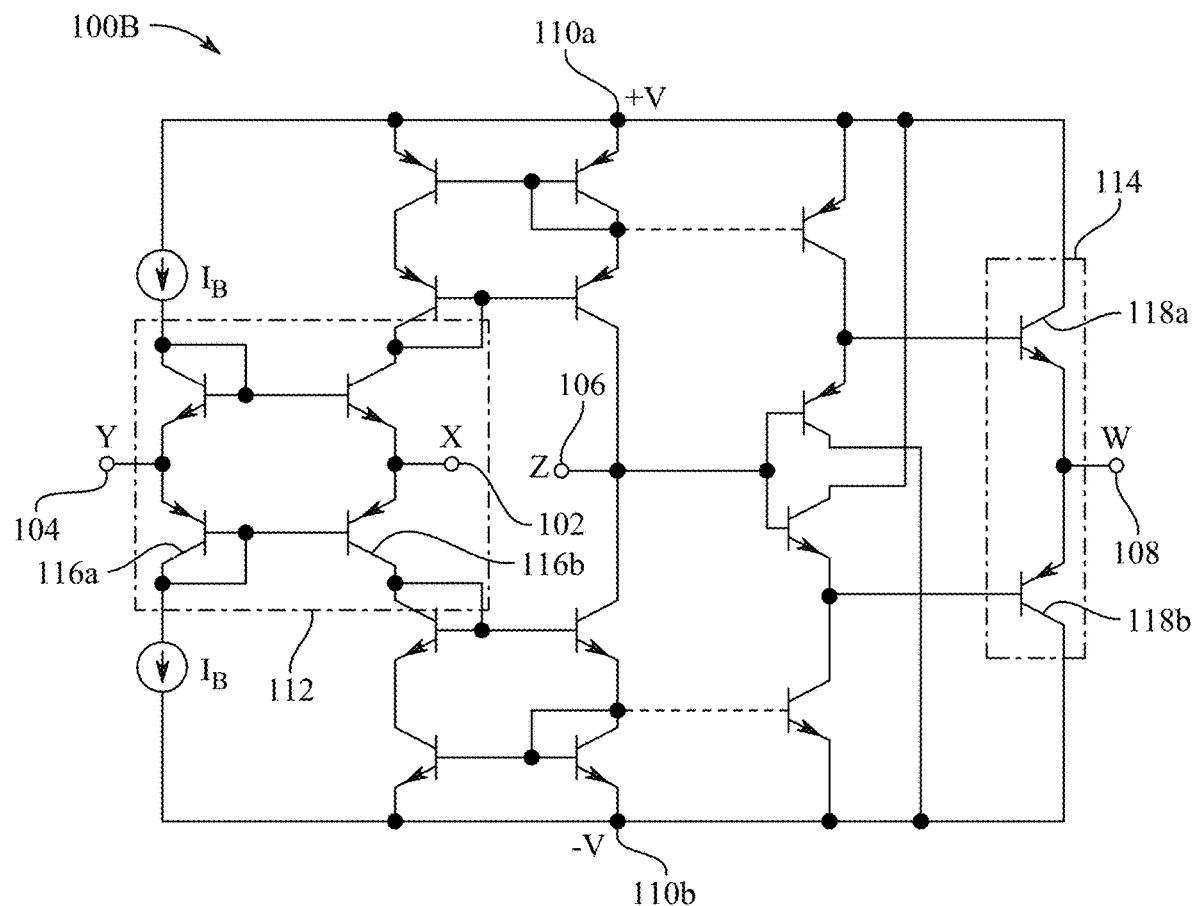
FIG. 1B illustrates an exemplary internal schematic of the CFOA shown in FIG. 1, according to certain embodiments.

FIG. 1B illustrates an exemplary internal schematic of the CFOA 100A shown in FIG. 1, hereinafter referred to as CFOA 100B. The CFOA 100B includes multiple functional terminals, such as the non-inverting input Y 104, the inverting input X 102, the internal output Z 106, the internal output W 108 and power supply terminals (+V, −V) 110a-110b.

The power supply terminals (+VS, −VS) 110a-110b provide symmetric bias voltages for the operation of the CFOA 100B. As used herein, the term "symmetric bias voltages" refers to a pair of direct current (DC) supply voltages that are equal in magnitude but opposite in polarity, used to power analog circuits like the CFOA 100B. In an aspect, the power supply terminal (+VS) 110a is connected to a positive direct current (DC) voltage (e.g., +15 Volts (V)), while the power supply terminal (−VS) 110b is connected to a negative DC voltage (e.g., −15 Volts (V)). The positive DC voltage and the negative DC voltage define an operating range of internal transistors of the CFOA 100B, thereby enabling the accommodation of both positive and negative signal swings at various circuit nodes. Symmetric biasing ensures the linear operation of internal analog building blocks, including a differential pair input stage 112, internal current mirrors (not shown), and an output buffer stage 114, facilitating bidirectional signal processing throughout a circuit.

The differential pair input stage 112 is located proximate to input terminals of the CFOA 100B, such as the non-inverting input Y 104 and the inverting input X 102. The differential pair input stage 112 includes a pair of transistors 116a-116b (e.g., bipolar junction transistors or metal-oxide-semiconductor field-effect transistors (MOSFETs)), which compare input voltage signals and generate an output current signal proportional to a voltage difference between the non-inverting input Y 104 and the inverting input X 102.

In an aspect, base terminals of the corresponding transistors 116a-116b are connected to the non-inverting input Y 104 and the inverting input X 102 of the CFOA 100B, respectively. When a differential input voltage $V_y-V_x$ is applied across the non-inverting input Y 104 and the inverting input X 102, the differential pair input stage 112 generates an imbalance in current flow. For instance, if $V_y>V_x$, the transistor 116a conducts more current than the transistor 116b; conversely, if $V_y<V_x$, the transistor 116b conducts more current than the transistor 116a.

The differential pair input stage 112 enables the CFOA 100B to amplify the voltage difference between the non-inverting input Y 104 and the inverting input X 102. This behavior results in a differential output current ($I_{diff}$) signal that is linearly proportional to the voltage difference between the non-inverting input Y 104 and the inverting input X 102, within a linear operating range. As used herein, the term "linear operating range" refers to a range of the voltage differences over which the differential pair input stage 112 operates linearly, meaning the output current signal is directly and proportionally related to the voltage difference between the input voltage signals.

A bias current $I_B$ is used to provide a constant current source for the differential pair input stage 112, ensuring that both the transistors 116a-116b are operating within their active region. The bias current $I_B$ helps establish a stable operating point for the differential pair input stage 112, enabling the differential pair input stage 112 to function properly and maintain linearity over a specified range of the input voltage differences. For example, when the bias current $I_B$ is set at 1 milliampere (mA), the transistors 116a-116b in the differential pair input stage 112 are biased correctly, providing a steady and predictable output current in response to the input voltage differences.

Following the differential pair input stage 112, a current replication mechanism (e.g., the internal current mirrors, though not explicitly shown in FIG. 1B) may be employed to replicate a collector current of the transistor 116b associated with the inverting input X 102. In an aspect, the collector current represents the output current signal that is generated by the differential pair input stage 112. The replicated current is directed towards the internal output Z 106. The current replication mechanism ensures that the current entering the inverting input X 102 (denoted as $I_x$) is equal to the current flowing into the internal output Z 106 (denoted as $I_z$), i.e., $I_x=I_z$. This current replication mechanism supports the current feedback behavior of the CFOA 100B, thereby facilitating high-speed operation and broad bandwidth performance.

The internal output Z 106 is an externally accessible terminal that is electrically coupled to the internal transimpedance node (not shown) through internal circuitry. As used herein, the term "transimpedance node" refers to an internal circuit node where an input current, such as the current entering the inverting input X 102, is converted into a corresponding voltage signal. The internal transimpedance node receives the current from the inverting input X 102, conveyed via the current replication mechanism. In an aspect, the current at the internal transimpedance node is not directly exposed externally; instead, the current undergoes a current-to-voltage conversion as part of an internal signal processing path. The converted voltage is subsequently buffered and made available at the internal output W 108, which serves as the low-impedance output voltage signal of the CFOA 100B.

In an aspect, the internal output W 108 may be electrically coupled to the output buffer stage 114 (i.e., an emitter of the output buffer stage 114), which receives the output voltage signal from the internal transimpedance node. The output buffer stage 114 includes a pair of complementary transistors 118a-118b (e.g., a negative-positive-negative (NPN) and a positive-negative-positive (PNP) transistor) configured in a push-pull configuration to reproduce the output voltage signal at the internal output W 108. In an aspect, the output buffer stage 114 presents the high input impedance to the internal transimpedance node and provides the low output impedance at the internal output W 108. Due to the high input impedance and the low output impedance of the output buffer stage 114, the output voltage signal at the internal output W 108 closely tracks the voltage signal at the internal transimpedance node. In operation, this configuration ensures that the voltage developed at the internal transimpedance node, which results from the current-to-voltage conversion, is accurately reproduced at the internal output W 108. Simultaneously, the low output impedance enables the CFOA 100B to source or sink significant output current into external loads without substantial signal degradation or loading effects. The internal schematic of the CFOA 100B demonstrates a distinct separation between a current input path (at the inverting input X 102) and a voltage output path (via the internal output W 108). This separation is a defining feature of the CFOA 100B and enables very high slew rates and bandwidths that are relatively independent of the closed-loop gain.

Figure 2:
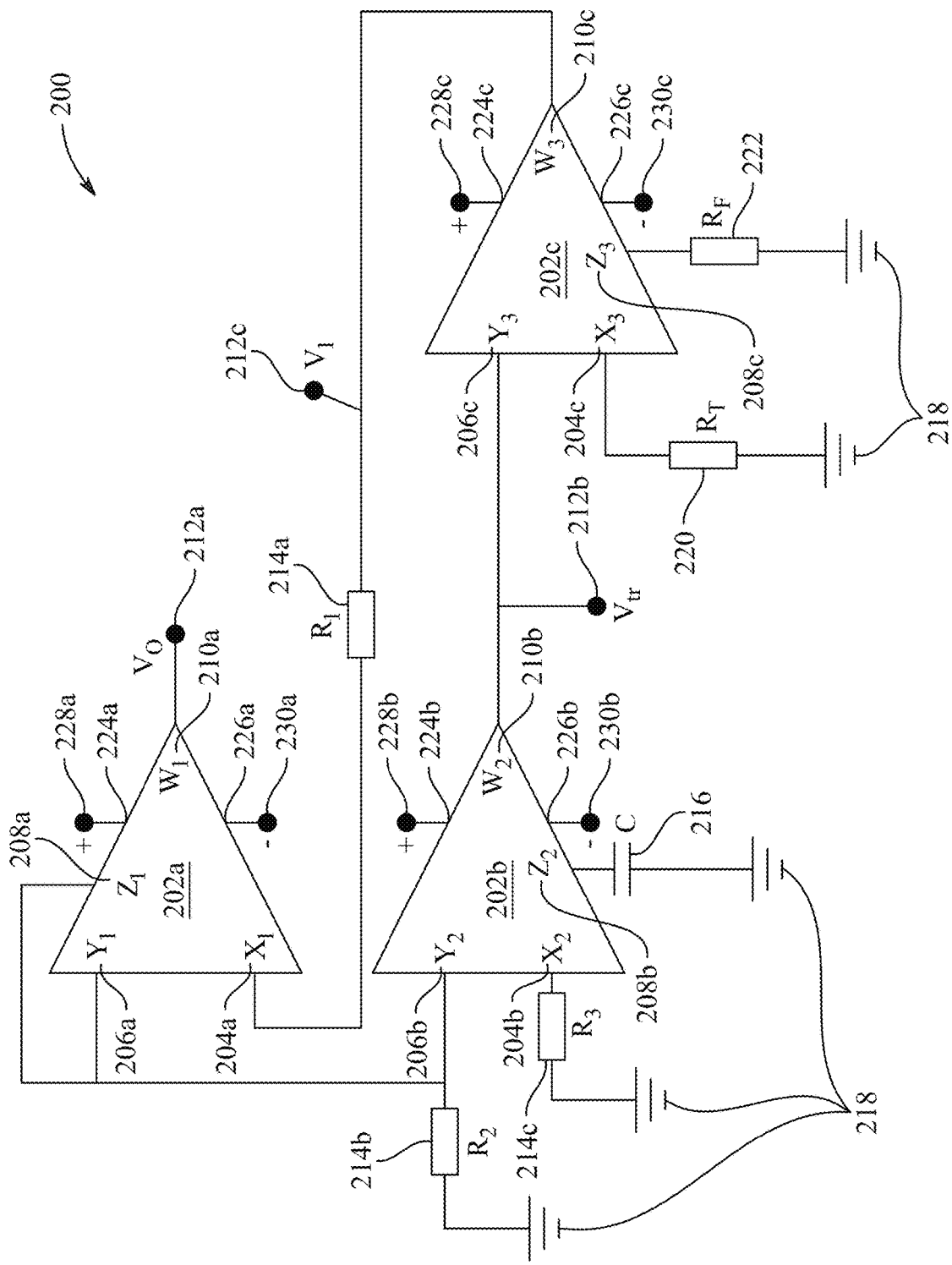
FIG. 2 illustrates an exemplary circuit of a resistance-to-frequency, resistance-to-time converter, according to certain embodiments.

FIG. 2 illustrates an exemplary circuit of a resistance-to-frequency, resistance-to-time converter 200 (hereinafter referred to as the converter 200). The converter 200 is configured to generate a square wave signal that alternates between a high voltage level and a low voltage level at regular time intervals, where the timing (i.e., frequency and period) of the square wave signal depends on values of variable resistors. The converter 200 includes CFOAs 202a-202c connected in a configuration that exploits internal characteristics of each CFOA 202a-202c. The internal characteristics of each CFOA 202a-202c may be, but not limited to, the high slew rate, the wide bandwidth, current-mode feedback behavior, and the like. As used herein, the term "current-mode feedback behavior" refers to a feedback mechanism in which an inverting input of the amplifier receives a current signal (rather than a voltage signal), which is then mirrored or replicated at an internal output node. This behavior enables the amplifier to achieve improved speed and linearity, and better stability under varying load and feedback conditions compared to the conventional VFOAs.

The converter 200 includes a first CFOA 202a having an inverting input $X_1$ 204a, a non-inverting input $Y_1$ 206a, an internal output $Z_1$ 208a, an internal output $W_1$ 210a, and an external output $V_O$ 212a. The non-inverting input $Y_1$ 206a is connected to the internal output $Z_1$ 208a to implement a unity-gain feedback configuration. As used herein, the term "unity-gain feedback configuration" refers to a configuration in which an output terminal of the amplifier is directly connected to an input terminal such that overall voltage gain is unity (i.e., the output voltage follows the input voltage).

In this configuration, the first CFOA 202a operates as a voltage follower. The voltage at the internal output $Z_1$ 208a is fed back to the non-inverting input $Y_1$ 206a, forming a feedback loop that forces the output to follow the input. The non-inverting input $Y_1$ 206a is a high-impedance voltage-sensing node, meaning it draws negligible current ($I_{Y1}$=0), which allows the applied input voltage signal to be sensed without loading a signal source.

The inverting input $X_1$ 204a is a low-impedance current input terminal. Internally, the first CFOA 202a includes the differential pair input stage 112 (as shown in FIG. 1B) that continuously senses the voltage difference between the non-inverting input $Y_1$ 206a and the inverting input $X_1$ 204a. If a mismatch is detected, for example: if $V_{X1} \neq V_{Y1}$, the first CFOA 202a adjusts the current at the inverting input $X_1$ 204a to drive the voltage $V_{X1}$ until the voltage at the inverting input $X_1$ 204a equals the voltage at the non-inverting input $Y_1$ 206a. This feedback mechanism ensures that $V_{X1}=V_{Y1}$, achieving voltage tracking at the current input terminal.

Once $V_{X1}=V_{Y1}$, the internal output $Z_1$ 208a is also driven to this same voltage because the voltage follower loop forces the internal output $Z_1$ 208a to mirror the voltage at the non-inverting input $Y_1$ 206a. This feedback path ensures $V_{Z1}=V_{Y1}$. The output buffer stage 114 (as shown in FIG. 1B) further replicates the voltage at the internal output $Z_1$ 208a to the internal output $W_1$ 210a, which in turn drives the external output $V_O$ 212a. Therefore, $V_{W1}=V_{Z1}$ and hence $V_O$ '₂ $V_{W1}=V_{Y1}$, completing a voltage tracking chain.

For instance, if a 5V input signal is applied to the non-inverting input $Y_1$ 206a, an internal feedback mechanism of the first CFOA 202a ensures that the voltage at the inverting input $X_1$ 204a is driven to match this value (5V), i.e., $V_{X1}=V_{Y1}$=5V. This voltage is mirrored at the internal output $Z_1$ 208a, passed through the output buffer stage 114 to the internal output $W_1$ 210a and ultimately appears at the external output $V_O$ 212a, resulting in $V_{Y1}=V_{X1}=V_{Z1}=V_{W1}=V_O$=5V.

In an aspect, the inverting input $X_1$ 204a is not directly connected to an input voltage source, such as a DC reference or an analog sensor output; rather, the inverting input $X_1$ 204a receives a feedback current signal from other circuit elements (e.g., through a resistor $R_1$ 214a, which is connected to an output of the third CFOA 202c, as described in detail below). Due to the internal structure of the first CFOA 202a, the current entering the low impedance inverting input $X_1$ 204a is internally mirrored to the internal output $Z_1$ 208a. This behavior is fundamental to the operation of the CFOA 100A (as shown in FIG. 1A) and is mathematically expressed as:

$$I_{Z1}=I_{X1}, \quad (2)$$

where $I_{Z1}$ indicates the current at the internal output $Z_1$ 208a and $I_{X1}$ indicates the current at the inverting input $X_1$ 204a. Equation (2) reflects the current conveyor behavior of the CFOA 100A, in which the inverting input $X_1$ 204a operates as a current input node and the internal output $Z_1$ 208a operates as a current output node. The equality ensures that the circuit elements connected to internal output $Z_1$ 208a respond directly to the current imposed on the inverting input $X_1$ 204a, enabling linear or switching behavior depending on the surrounding circuit configuration.

In an aspect, the first CFOA 202a functions as a switching element, and the external output $V_O$ 212a produced at the internal output $W_1$ 210a is a square wave that alternates between a positive amplitude $V_{SAT+}$ and a negative amplitude $V_{SAT-}$. The square wave having the positive amplitude $V_{SAT+}$ and the negative amplitude $V_{SAT-}$ at the external output $V_O$ 212a is generated by selecting a magnitude of the resistor $R_1$ 214a, a magnitude of a resistor $R_2$ 214b, a magnitude of a resistor $R_3$ 214c, a magnitude of a positive DC voltage 228a or 228b or 228c, a magnitude of a negative DC voltage 230a or 230b or 230c, a magnitude of a variable resistor $R_T$ 220, a magnitude of a capacitor C 216 and a magnitude of a variable resistor $R_F$ 222. In a non-limiting example, the magnitude of the resistor $R_1$ 214a is about 1 kΩ, the magnitude of the resistor $R_2$ 214b is about 10 kΩ, a magnitude of the resistor $R_3$ 214c is about 1 kΩ, the magnitude of the variable resistor $R_T$ 220 is in a range of about 1 kQ to about 5 kΩ, the magnitude of the variable resistor $R_F$ 222 is in a range of about 1 kQ to about 10 kΩ, and the magnitude of the capacitor C 216 is about 10 nanofarad (nF).

The positive amplitude $V_{SAT+}$ and the negative amplitude $V_{SAT-}$ correspond to saturation limits of the first CFOA 202a. As used herein, the term "saturation limits" refers to maximum and minimum output voltages that the amplifier can achieve, which are determined by supply voltages and an internal design of the amplifier. The saturation limits are slightly lower than corresponding positive and negative supply voltages due to internal voltage drops within the output stage of the amplifier. When the amplifier attempts to drive the output beyond the saturation limits, the output voltage saturates and levels off at the corresponding maximum and minimum value. For example, the maximum positive voltage that the output of the first CFOA 202a can reach is slightly less than a positive supply rail (e.g., approximately +8.5 V for a ±9 V supply). Similarly, the maximum negative voltage that the output of the first CFOA 202a can swing to is slightly above a negative supply rail (e.g., approximately −8.5 V for a ±9 V supply).

The external output $V_O$ 212a has a period T proportional to a ratio of the magnitude of the variable resistor $R_T$ 220 to the variable resistor $R_F$ 222. By varying the magnitude of the variable resistor $R_T$ 220 and the magnitude of the variable resistor $R_F$ 222, the period T of the square wave at the external output $V_O$ 212a may be selectively adjusted. In an aspect, increasing the variable resistor $R_T$ 220 results in an increase in the period T, while decreasing the variable resistor $R_T$ 220 results in a decrease in the period T. Similarly, increasing the resistor $R_F$ 222 results in the decrease in the period T, while decreasing the variable resistor $R_F$ 222 results in the increase in the period T.

The external output $V_O$ 212a has a frequency of oscillation f proportional to the ratio of the magnitude of the variable resistor $R_F$ 222 to the magnitude of the variable resistor $R_T$ 220. By varying the magnitude of the variable resistor $R_T$ 220 and the magnitude of the variable resistor $R_F$ 222, the frequency of oscillation f of the square wave at the external output $V_O$ 212a may be selectively adjusted. In an aspect, increasing the variable resistor $R_T$ 220 results in a decrease in the frequency of oscillation f, while decreasing the variable resistor $R_T$ 220 results in an increase in the frequency of oscillation f. Similarly, increasing the variable resistor $R_F$ 222 results in an increase in the frequency of oscillation f, while decreasing the variable resistor $R_F$ 222 results in a decrease in the frequency of oscillation f.

The converter 200 also includes a second CFOA 202b having an inverting input $X_2$ 204b, a non-inverting input $Y_2$ 206b, an internal output $Z_2$ 208b, an internal output $W_2$ 210b and an external output $V_{tr}$ 212b. The non-inverting input $Y_2$ 206b is connected to the resistor $R_2$ 214b, and to the non-inverting input $Y_1$ 206a of the first CFOA 202a. This configuration allows for signal interaction between two stages (i.e., the first CFOA 202a and the second CFOA 202b). The inverting input $X_2$ 204b is connected to the resistor $R_3$ 214c, and the internal output $Z_2$ 208b is connected to the capacitor C 216. The resistor $R_2$ 214b, the resistor $R_3$ 214c and the capacitor C 216 are connected to a ground terminal 218, providing essential return paths and enabling the capacitor C 216 to influence the voltage behavior at the external output $V_{tr}$ 212b.

The internal output $W_2$ 210b is configured to deliver the external output $V_{tr}$ 212b. The external output $V_{tr}$ 212b represents a signal produced by the second CFOA 202b of the converter 200. In an aspect, the external output $V_{tr}$ 212b may be affected by a feedback loop including the resistor $R_3$ 214c and the capacitor C 216, as well as the interaction of the second CFOA 202b with the first CFOA 202a through a shared connection at the non-inverting input $Y_1$ 206a. The external output $V_{tr}$ 212b is a triangular wave with a positive amplitude $V_{tr+}$ and a negative amplitude $V_{tr-}$. As used herein, the term "positive amplitude $V_{tr+}$" refers to a maximum voltage level attained by the triangular wave before the voltage level starts decreasing. Also, as used herein, the term "negative amplitude $V_{tr+}$" refers to a minimum voltage level attained by the triangular wave before the voltage level starts increasing. In an aspect, the positive amplitude $V_{tr+}$ and the negative amplitude $V_{tr-}$ may depend on the saturation limits ($V_{SAT+}$ and $V_{SAT-}$) of the first CFOA 202a and the integration behavior in a triangular wave generation stage.

The triangular wave results from the linear charging and discharging behavior of the capacitor C 216 through the resistor $R_3$ 214c, which causes the external output $V_{tr}$ 212b to increase and decrease linearly over time. However, depending on the specific configuration of the circuit of the converter 200, the external output $V_{tr}$ 212b may alternatively exhibit the square wave, if the charging and discharging behavior of the capacitor C 216 is altered or bypassed through design modifications.

For instance, when the external output $V_O$ 212a of the first CFOA 202a provides the square wave signal with the positive amplitude $V_{SAT+}$, and the square wave signal is applied to the non-inverting input $Y_2$ 206b of the second CFOA 202b, a current flows through the resistor $R_3$ 214c into the inverting input $X_2$ 204b. As a result, the internal output $Z_2$ 208b sources the corresponding current to charge the capacitor C 216. This charging causes the voltage across the capacitor C 216, and thus the external output $V_{tr}$ 212b to increase linearly due to constant current charging. When the external output $V_O$ 212a subsequently switches to the negative amplitude $V_{SAT-}$, the polarity of the voltage at the non-inverting input $Y_2$ 206b reverses, causing the current to flow in an opposite direction. This reversal leads to the linear discharge of the capacitor C 216. This continuous charging and discharging process results in the characteristic triangular wave at the external output $V_{tr}$ 212b. Accordingly, the external output $V_{tr}$ 212b swings between the positive amplitude $V_{tr+}$ and the negative amplitude $V_{tr-}$.

The converter 200 also includes a third CFOA 202c having an inverting input $X_3$ 204c, a non-inverting input $Y_3$ 206c, an internal output $Z_3$ 208c, an internal output $W_3$ 210c, and an external output $V_1$ 212c. The external output $V_1$ 212c is connected by the resistor $R_1$ 214a to the inverting input $X_1$ 204a. This connection forms the feedback path that completes a control loop, allowing the external output $V_1$ 212c of the third CFOA 202c to influence the behavior of the first CFOA 202a, which in turn affects the triangular wave generation and buffering process. The inverting input $X_3$ 204c is connected to the variable resistor $R_T$ 220. The internal output $Z_3$ 208c is connected to the variable resistor $R_F$ 222.

The non-inverting input $Y_3$ 206c is connected to the external output $V_{tr}$ 212b of the second CFOA 202b. This means that the triangular wave generated at the internal output $W_2$ 210b is used as an input signal to the third CFOA 202c. As the triangular wave swings between the positive amplitude $V_{tr+}$ and the negative amplitude $V_{tr-}$, it causes the output of the third CFOA 202c to respond accordingly.

In an aspect, the input voltage (i.e., external output $V_{tr}$ 212b) influences the behavior of the third CFOA 202c. The external output $V_{tr}$ 212b is applied to the non-inverting input $Y_3$ 206c of the third CFOA 202c. In this configuration, the third CFOA 202c is set up as a non-inverting amplifier using the variable resistors $R_F$ 222 and $R_T$ 220 to define a voltage gain. Specifically, the variable resistor $R_F$ 222 is connected from the internal output $Z_3$ 208c to the inverting input $X_3$ 204c, and the variable resistor $R_T$ 220 is connected from the inverting input $X_3$ 204c to the ground terminal 218. This configuration results in the voltage gain of $(1+R_F/R_T)$, amplifying the external output $V_{tr}$ 212b applied at the non-inverting input $Y_3$ 206c.

The amplified voltage signal appears at the internal output $Z_3$ 208c and is buffered by the internal output $W_3$ 210c to produce the external output $V_1$ 212c. The external output $V_1$ 212c is then fed through the resistor $R_1$ 214a into the inverting input $X_1$ 204a of the first CFOA 202a. This feedback arrangement causes the current ($I_{x1}$) into the inverting input $X_1$ 204a to vary with the external output $V_{tr}$ 212b, and the current ($I_{x1}$) influences the switching condition of the first CFOA 202a. In an aspect, when the current ($I_{x1}$) into the inverting input $X_1$ 204a falls below an internal reference current ($I_{z1}$) sourced by the internal output $Z_1$ 208a, the first CFOA 202a switches the external output $V_O$ 212a between the saturation limits $V_{SAT+}$ and $V_{SAT-}$. This switching action produces the square wave at the external output $V_O$ 212a, which serves as the input to the second CFOA 202b and determines how fast the capacitor C 216 charges and discharges, thereby generating the next cycle of the triangular wave. As a result, the frequency of the square wave is controlled by a rate at which the capacitor C 216 charges and discharges, which depends on the amplitude of the triangular wave. This amplitude may be adjusted by external conditions.

In operation, the three CFOAs 202a-202c work together to form the converter 200 based on a closed-loop oscillation mechanism. In a first stage, the first CFOA 202a is configured with the unity-gain feedback configuration by connecting the non-inverting input $Y_1$ 206a to the internal output $Z_1$ 208a. This configuration ensures that $V_{X1}=V_{Y1}=V_{Z1}=V_0$, causing the external output $V_0$ 212a to toggle between the two saturation limits $V_{SAT+}$ and $V_{SAT-}$, producing the square wave signal. This square wave signal is simultaneously fed to the non-inverting input $Y_2$ 206b of the second CFOA 202b.

In a second stage, the second CFOA 202b uses the square wave signal at the non-inverting input $Y_2$ 206b as its input. Due to the internal condition of the CFOA 100A, where $V_{X2}=V_{Y2}$, the voltage at the inverting input $X_2$ 204b also reflects the square wave signal (i.e., the external output $V_0$ 212a). Since the inverting input $X_2$ 204b is connected to the ground terminal 218 through the resistor $R_3$ 214c, the current $I_{X2}=V_0/R_3$ flows into the internal transimpedance node (as discussed in FIG. 1B). According to operating characteristics of the CFOA 100A, where $I_{X2}=I_{Z2}$, this current is mirrored to the internal output $Z_2$ 208b which is connected to the capacitor C 216. When the external output $V_0$ 212a of the first CFOA 202a is $V_{SAT+}$, the capacitor C 216 charges through the resistor $R_3$ 214c, resulting in a linearly increasing external voltage $V_{tr}$ 212b at the internal output $W_2$ 210b of the second CFOA 202b. The charging current in this state is $I=V_{SAT+}/R_3$. Conversely, when the external output $V_0$ 212a of the first CFOA 202a is $V_{SAT-}$, the polarity of the voltage at the inverting input $X_2$ 204b reverses, and the capacitor C 216 discharges with the constant current $I=V_{SAT}/R_3$, causing the external voltage $V_{tr}$ 212b to decrease linearly. As the capacitor C 216 charges or discharges linearly with the constant current in alternating directions, the external voltage $V_{tr}$ 212b appears at the internal output $W_2$ 210b swinging between the $V_{tr+}$ and $V_{tr-}$.

The external output $V_{tr}$ 212b is then sent to the non-inverting input $Y_3$ 206c of the third CFOA 202c. Since $I_{Y3}=0$, the external output $V_{tr}$ 212b can be sensed without loading the circuit. According to the operating characteristics of the CFOA 100A, where $V_{X3}=V_{Y3}$, the voltage at the inverting input $X_3$ 204c also equals the external output $V_{tr}$ 212b. The inverting input $X_3$ 204c is connected to the ground terminal 218 via the variable resistor $R_T$ 220 so the current $I_{X3}=V_{tr}/R_T$ flows through it. According to a current-mirroring property $I_{X3}=I_{Z3}$, this current flows through another variable resistor $R_F$ 222 connected to the internal output $Z_3$ 208c, producing the output voltage $V_1=(R_F/R_T)*V_{tr}$. This gain-adjusted version of the triangular wave appears at the external output $V_1$ 212c and is routed back through the resistor $R_1$ 214a to the inverting input $X_1$ 204a of the first CFOA 202a.

This feedback connection is critical for closing the oscillation loop. The external output $V_0$ 212a controls the slope of the triangular wave, which, after amplification, affects the external output $V_1$ 212c. This, in turn, affects the current through the resistor $R_1$ 214a into the inverting input $X_1$ 204a. As the external output $V_{tr}$ 212b ramps up or down, the external output $V_1$ 212c also changes proportionally. The voltage drop across the resistor $R_1$ 214a (between $V_1$ and $V_{X1}$) modulates the current $I_{X1}$. Initially, when the external output $V_0$ 212a is high ($V_{SAT+}$), the capacitor C 216 charges, and the external output $V_{tr}$ 212b increases. Consequently, the external output $V_1$ 212c rises, increasing the current $I_{X1}$ that flows through the resistor $R_1$ 214a. At some point, as the external output $V_{tr}$ 212b continues to increase, the current $I_{X1}$ flowing through the resistor $R_1$ 214a decreases due to the voltage difference between $V_1$ and $V_{X1}$. When the current $I_{X1}$ becomes less than the internally sourced current $I_{Z1}$ (mirrored from the internal structure), the first CFOA 202a switches a state, flipping the external output $V_0$ 212a to $V_{SAT-}$. This reversal discharges the capacitor C 216 in the opposite direction, reversing the slope of the external output $V_{tr}$ 212b, and the process repeats cyclically.

Each of the CFOAs 202a-202c in the converter 200 is powered using a dual symmetric DC supply, where a positive bias input 224a or 224b or 224c of the corresponding CFOAs 202a or 202b or 202c is connected to the positive DC voltage 228a or 228b or 228c, and a negative bias input 226a or 226b or 226c of the corresponding CFOAs 202a or 202b or 202c is connected to a negative DC voltage 230a or 230b or 230c of equal magnitude. In an aspect, each CFOA 202a-202c is biased at the positive bias input 224a or 224b or 224c with +9 volts and at the negative bias input 226a or 226b or 226c with −9 volts. This dual-supply configuration enables the CFOAs 202a-202c to handle bipolar signal swings, allowing the external output $V_0$ 212a to oscillate between a positive saturation limit ($V_{SAT+}$) and a negative saturation limit ($V_{SAT-}$), and the external output $V_{tr}$ 212b to ramp linearly between corresponding voltage limits.

The cyclic behavior described above (i.e., switching of the external output $V_0$ 212a) between two distinct voltage levels is driven by the operation of each CFOA 202a-202c in a voltage-saturated mode. This saturation-based switching mechanism is fundamental to timing and waveform generation in the converter 200.

In the voltage-saturated mode, each CFOA 202a-202c alternates the corresponding external output ($V_0$, $V_{tr}$, $V_1$) 212a, 212b, 212c between the predefined positive saturation limit ($V_{SAT+}$) and the negative saturation limit ($V_{SAT-}$) of the square wave signal. In an aspect, the internal configuration of each CFOA 202a-202c is driven by differential input conditions, and the unity-gain feedback loop causes the external output $V_0$ 212a to rapidly transition to either the positive saturation limit ($V_{SAT+}$) or the negative saturation limit ($V_{SAT-}$) when the input voltage difference exceeds a defined threshold. For instance, when the capacitor C 216 charges to a voltage slightly above a reference level, the internal feedback mechanism drives the external output $V_0$ 212a to $V_{SAT-}$. Conversely, when the capacitor C 216 discharges below the reference level, the internal feedback mechanism switches the external output $V_0$ 212a to $V_{SAT+}$. This behavior results in the generation of a bipolar square wave at the external output $V_0$ 212a, where the saturation voltages $V_{SAT-}$ and $V_{SAT+}$ are defined by the supply voltages and internal characteristics of each CFOA 202a-202c.

This voltage-saturation behavior is leveraged to control the timing characteristics of the converter 200. In an aspect, a duration of each saturated state, i.e., a time interval during which the external output $V_0$ 212a remains at $V_{SAT-}$ or $V_{SAT+}$ is influenced by the linear charge and discharge rates of the capacitor C 216, which are determined by values of the resistors $R_T$ 220, $R_F$ 222 and $R_3$ 214c associated with the second CFOA 202b and the third CFOA 202c. As a result, the period T of the square wave at the external output $V_0$ 212a is proportional to the resistance ratio $R_T/R_F$, and the corresponding frequency of oscillation f is proportional to the resistance ratio $R_F/R_T$.

Further, to quantitatively determine a peak-to-peak amplitude of the triangular wave (i.e., external output $V_{tr}$ 212b), an ideal current mirroring behavior of the first CFOA 202a is considered. Under ideal conditions of the CFOA 100A, the current entering the inverting input $X_1$ 204a is mirrored at the internal output $Z_1$ 208a.

By applying Kirchhoff's current law at the inverting input $X_1$ 204a, the total current is a sum of two current components, such as the current flowing from the positive saturation voltage ($V_{SAT+}$) through the resistor $R_2$ 214b, and the feedback current flowing through the resistor $R_1$ 214a from the external output $V_1$ 212c. This yields the following current balance equation:

$$V_{SAT+}/R_2=(V_{SAT+}-V_1)/R_1 \quad (3)$$

$$V_1=V_{SAT+}(1-(R_1/R_2)) \quad (4)$$

However, from the operation of the third CFOA 202c, the external output $V_1$ 212c is a scaled version of the triangular wave, such that:

$$V_1=(R_F/R_T)*V_{tr} \quad (5)$$

By combining equations (3) and (4), an expression for the positive amplitude $V_{tr+}$ of the external output $V_{tr}$ 212b is obtained.

$$V_{tr+}=[V_{SAT+}(1-(R_1/R_2))](R_T/R_F) \quad (6)$$

Similarly, when the first CFOA 202a toggles to the negative saturation state $V_{SAT-}$, an expression for the negative amplitude $V_{tr-}$ of the external output $V_{tr}$ 212b is obtained.

$$V_{tr-}=[V_{SAT+}-(1-(R_1/R_2))](R_T/R_F) \quad (7)$$

Thus, equations (6) and (7) define the upper and lower bounds of the triangular wave, which are directly influenced by the resistive ratios ($R_1/R_2$) and ($R_T/R_F$).

Further, to derive the time-domain behavior (i.e., the period T and frequency of oscillation f of the external output $V_O$ 212a) of the converter 200, the linear charging and discharging of the capacitor C 216 are analyzed. The external output $V_{tr}$ 212b (i.e., triangular wave) ramps linearly between the positive amplitude $V_{tr+}$ and the negative amplitude $V_{tr-}$ due to the constant current charging and discharging, driven by the third CFOA 202c through the resistor $R_3$ 214c. The total peak-to-peak swing of the external output $V_{tr}$ 212b is given by:

$$\Delta V_{tr}=V_{tr+}-V_{tr-} \quad (8)$$

Since the charging and discharging currents are given by $I=V_{SAT+}/R_3$ and $I=V_{SAT-}/R_3$, respectively, and a constant capacitance C is assumed, the time $T_1$ required to ramp from $V_{tr-}$ to $V_{tr+}$ is calculated using equation (9):

$$((V_{tr+}-V_{tr-})/T_1)=((V_{SAT+}/R_3)/C) \quad (9)$$

$$((1-(R_1/R_2))(R_T/R_F)(V_{SAT+}-V_{SAT-}))/T_1=((V_{SAT+}/R_3)/C) \quad (10)$$

Solving for $T_1$ yields:

$$T_1=CR_3(1-(R_1/R_2))(R_T/R_F)(1-(V_{SAT-}-V_{SAT+})) \quad (11)$$

Similarly, the time $T_2$ to ramp from $V_{tr+}$ to $V_{tr-}$ (during capacitor discharge) is:

$$T_2=CR_3(1-(R_1/R_2))(R_T/R_F)(1-(V_{SAT+}-V_{SAT-})) \quad (12)$$

In the practical case where the saturation voltages are equal and opposite, i.e., $V_{SAT+}=-V_{SAT-}$, the equations for $T_1$ and $T_2$ become:

$$T_1 = 2CR_3(1+(R_1/R_2))(R_T/R_F) \quad (13)$$

$$T_2 = 2CR_3(1(R_1/R_2))(R_T/R_F) \quad (14)$$

Accordingly, the period T of the square wave at the external voltage $V_0$ 212a is the sum of $T_1$ and $T_2$, given by:

$$T=T_1+T_2=4CR_3(1-(R_1/R_2))(R_T/R_F) \quad (15)$$

Based on equation (15), the period T of the square wave is set by selecting an appropriate ratio of the magnitude of the variable resistor $R_T$ 220 to the magnitude of the variable resistor $R_F$ 222. The corresponding frequency of oscillation f of the square wave at the external voltage $V_0$ 212a is a reciprocal of the period T and is calculated using equation (16):

$$f=1/T=(1/(4CR_3(1-(R_1/R_2))))(R_F/R_T)), \quad (16)$$

where $R_1 < R_2$. The frequency of oscillation f is set by selecting the ratio of the magnitude of the variable resistor $R_F$ 222 to the magnitude of the variable resistor $R_T$ 220 based on equation (16).

Equation (15) indicates that if the variable resistor $R_T$ 220 is replaced with a resistive sensor, the period T of the square wave varies linearly with the resistance of the resistive sensor, allowing the circuit to function as a resistance-to-time converter. Equation (16) indicates that if the variable resistor $R_F$ 222 is replaced with the resistive sensor, the frequency of oscillation f varies linearly with the resistance of the resistive sensor, enabling operation as a resistance-to-frequency converter. For correct operation of the converter 200 in both configurations, it is important to ensure that resistor $R_1$ 214a is smaller than resistor $R_2$ 214b (i.e., $R_1 < R_2$).

Experimental Analysis

Figure 3:
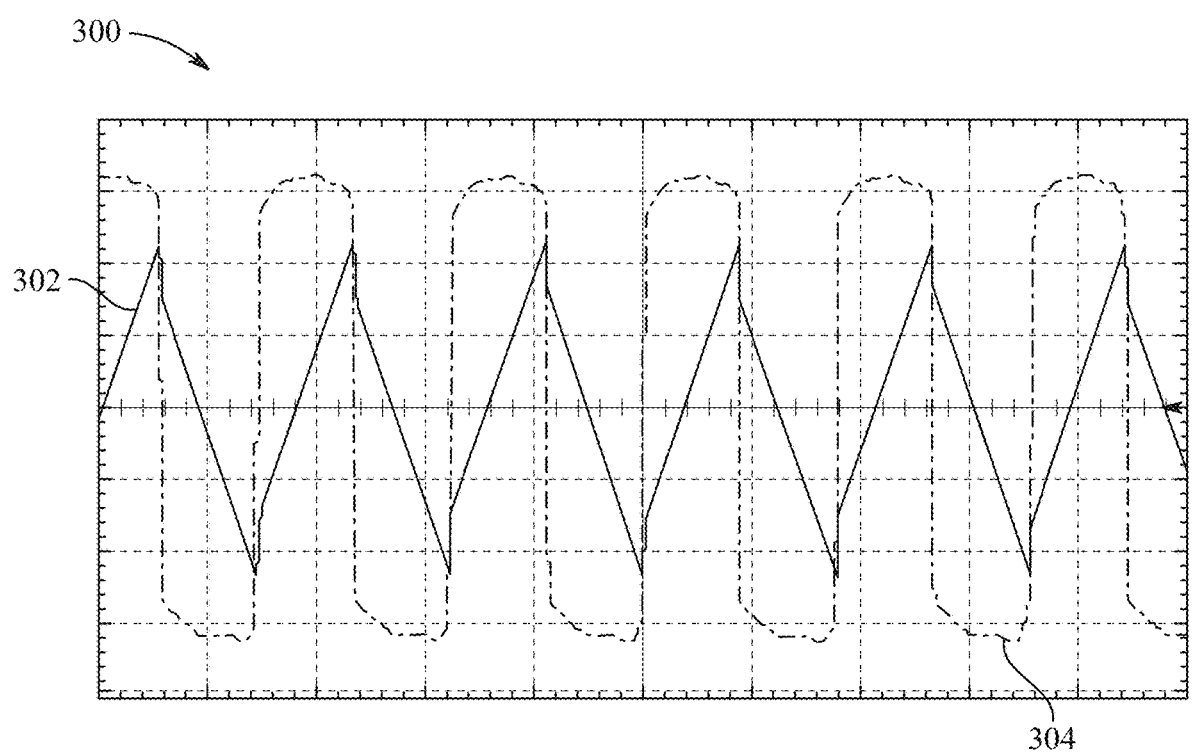
FIG. 3 illustrates a graphical representation of experimentally measured waveforms corresponding to an external output $V_0$ and an external output $V_{tr}$ generated by the converter using CFOAs, according to certain embodiments.

FIG. 3 illustrates a graphical representation 300 of experimentally measured waveforms corresponding to the external output $V_O$ 212a and the external output $V_{tr}$ 212b generated by the converter 200 using the CFOAs 202a-202c. The experiment was conducted under the following component conditions: the resistor $R_1$ 214a=1 kΩ, the resistor $R_2$ 214b=10 kΩ, the resistor $R_3$ 214c=1 kΩ, the variable resistor $R_T$ 220=5 kΩ, the variable resistor $R_F$ 222=10 kΩ and the capacitor C 216=10 nF. Referring to FIG. 3, a waveform 302 represents the triangular wave external output $V_{tr}$ 212b, and a waveform 304 represents the square wave external output $V_O$ 212a. In this experiment, the measured frequency of oscillation f and period T, calculated using equations (15) and (16), were approximately 56.28 kHz and 17.78 μs, respectively. The peak-to-peak voltage of the external output $V_{tr}$ 212b was approximately 4.68 V, whereas the external output $V_O$ 212a exhibited a peak-to-peak amplitude of 12.8 V. This indicated a near full swing behavior approaching the ±9 V DC supply rails, consistent with saturation characteristics of the converter 200. The term "full swing near the DC voltages" refers to the output voltage reaching amplitudes close to the positive bias input 224a or 224b or 224c and negative bias input 226a or 226b or 226c of the CFOAs 202a or 202b or 202c. In this configuration, where the positive bias input 224a or 224b or 224c is connected to +9 V DC 228a or 228b or 228c and the negative bias input 226a or 226b or 226c is connected to −9 V DC 230a or 230b or 230c, a maximum theoretical output swing is 18 V peak-to-peak. The measured 12.8 V peak-to-peak swing confirmed that the external output $V_O$ 212a operated within a high dynamic range, utilizing the full capability of the CFOA 100B under large-signal conditions. In contrast, the external output $V_{tr}$ 212b, which is generated through capacitor integration of a constant current, maintained a lower peak-to-peak voltage, consistent with its linear charging and discharging behavior.

Figure 4:
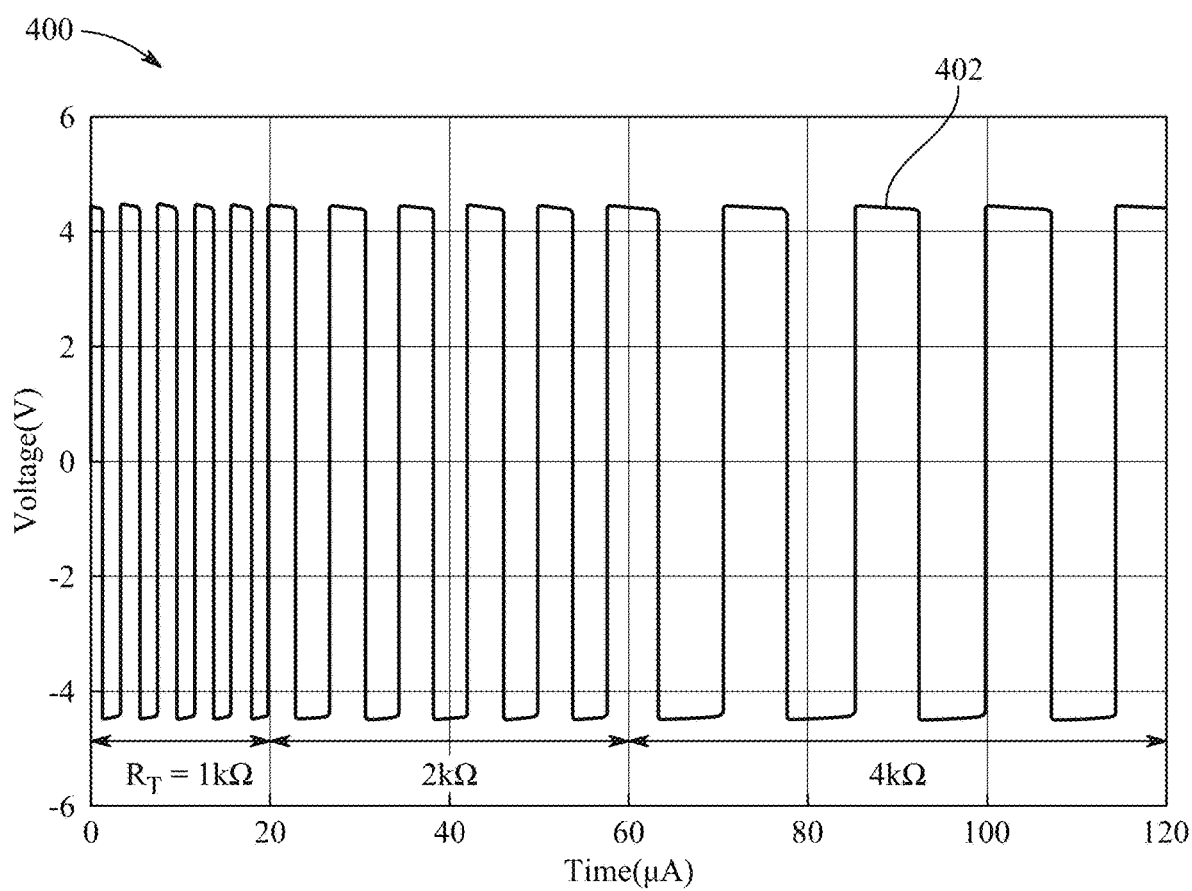
FIG. 4 illustrates a graphical representation of simulated time-domain response at the external output $V_0$ of the converter, with an oscillation period plotted against different values of a variable resistor $R_T$, according to certain embodiments.

FIG. 4 illustrates a graphical representation 400 of the simulated time-domain response of the external output $V_O$ 212a of the converter 200, with an oscillation period plotted against different values of the variable resistor $R_T$ 220. The variable resistor $R_T$ 220 operated as a resistive sensor. In this simulation, the converter 200 employed AD844 CFOAs 202a-202c with internal parameters and external circuit components. The internal parameters include input resistances $R_X$=50Ω, $R_Y$=10Ω, $R_Z$=10Ω and parasitic capacitances $C_Y$=$C_Z$=4.5 pF. The external circuit components include the resistor $R_1$ 214a=1 kΩ, the resistor $R_2$ 214b=10 kΩ, the resistor $R_3$ 214c=1 kΩ, the variable resistor $R_F$ 222=10 kΩ and the capacitor C 216=10 nF. The circuit was powered using the ±9V DC supply.

The variable resistor $R_T$ 220 varied from 1 kΩ to 4 kΩ, and its effect is shown in rectangular regions 402 of FIG. 4. Each rectangular region 402 represents the time-domain response of the converter 200 for a specific value of the variable resistor $R_T$ 220. During the simulation, it was observed that the period T of the external output $V_O$ 212a increased progressively with higher values of the variable resistor $R_T$ 220, confirming the linear relationship between the period T and the variable resistor $R_T$ 220 as defined by equation (15).

Figure 5:
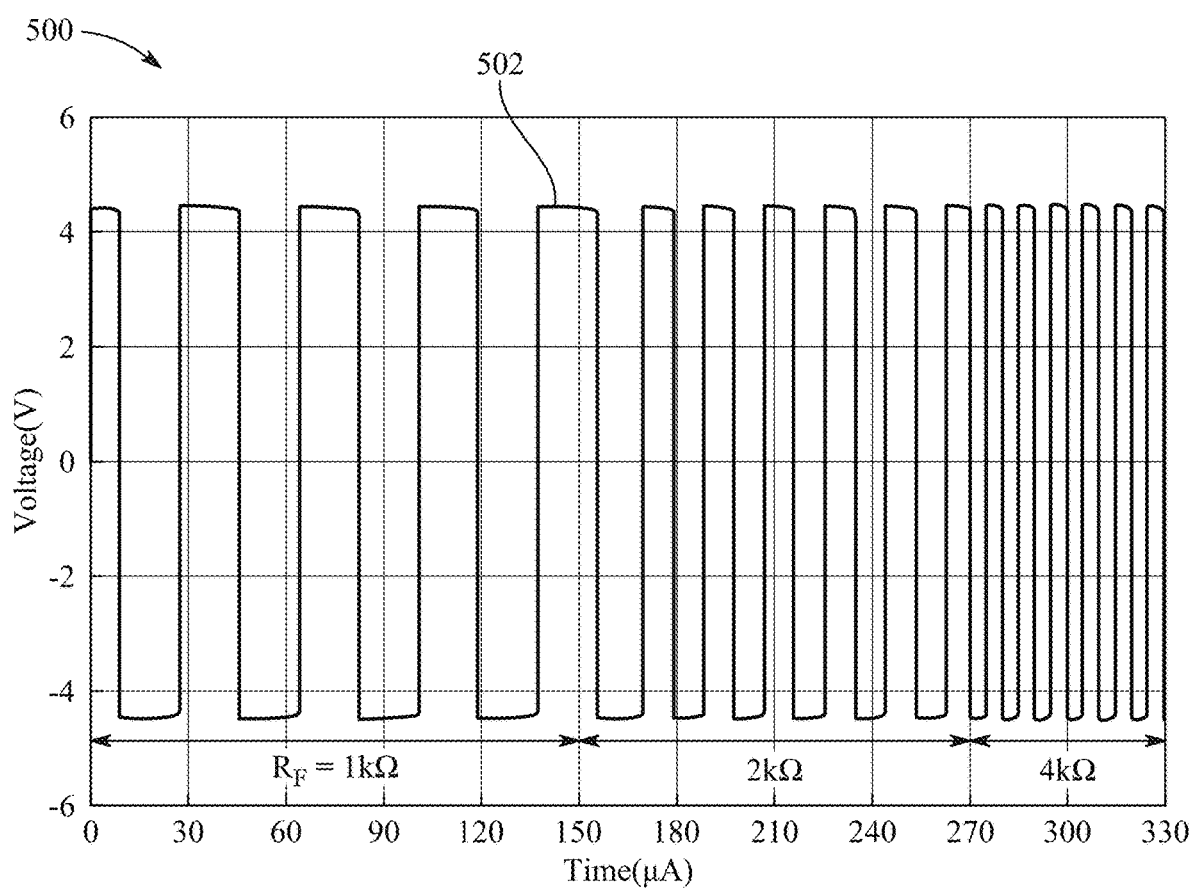
FIG. 5 illustrates a graphical representation of the simulated time-domain response at the external output $V_0$ of the converter, with an oscillation frequency plotted against different values of a variable resistor $R_F$, according to certain embodiments.

FIG. 5 illustrates a graphical representation 500 of simulated time-domain response at the external output $V_O$ 212a of the converter 200, with an oscillation frequency plotted against different values of the variable resistor $R_F$ 222. The variable resistor $R_F$ 222 operated as the resistive sensor. In this simulation, the variable resistor $R_T$ 220 was fixed at 10 kΩ. External circuit components, including the resistor $R_1$ 214a=1 kΩ, the resistor $R_2$ 214b=10 kΩ, the resistor $R_3$ 214c=1 kΩ, and the capacitor C 216=10 nF, were also used during the simulation. The circuit was powered using the ±9V DC supply.

The variable resistor $R_F$ 222 varied from 1 kΩ to 4 kΩ, and its effect is shown in rectangular regions 502 of FIG. 5. Each rectangular region 502 represents the time-domain response of the converter 200 for a specific value of the variable resistor $R_F$ 222. During the simulation, it was observed that the frequency of oscillation f of the external output $V_O$ 212a increased progressively with higher values of the variable resistor $R_F$ 222, confirming the direct relationship between the frequency of oscillation f and the variable resistor $R_F$ 222 as defined by equation (16). Hence, FIG. 5 visually demonstrates that the converter 200 can serve as a frequency-based readout system for the resistive sensors.

Figure 6:
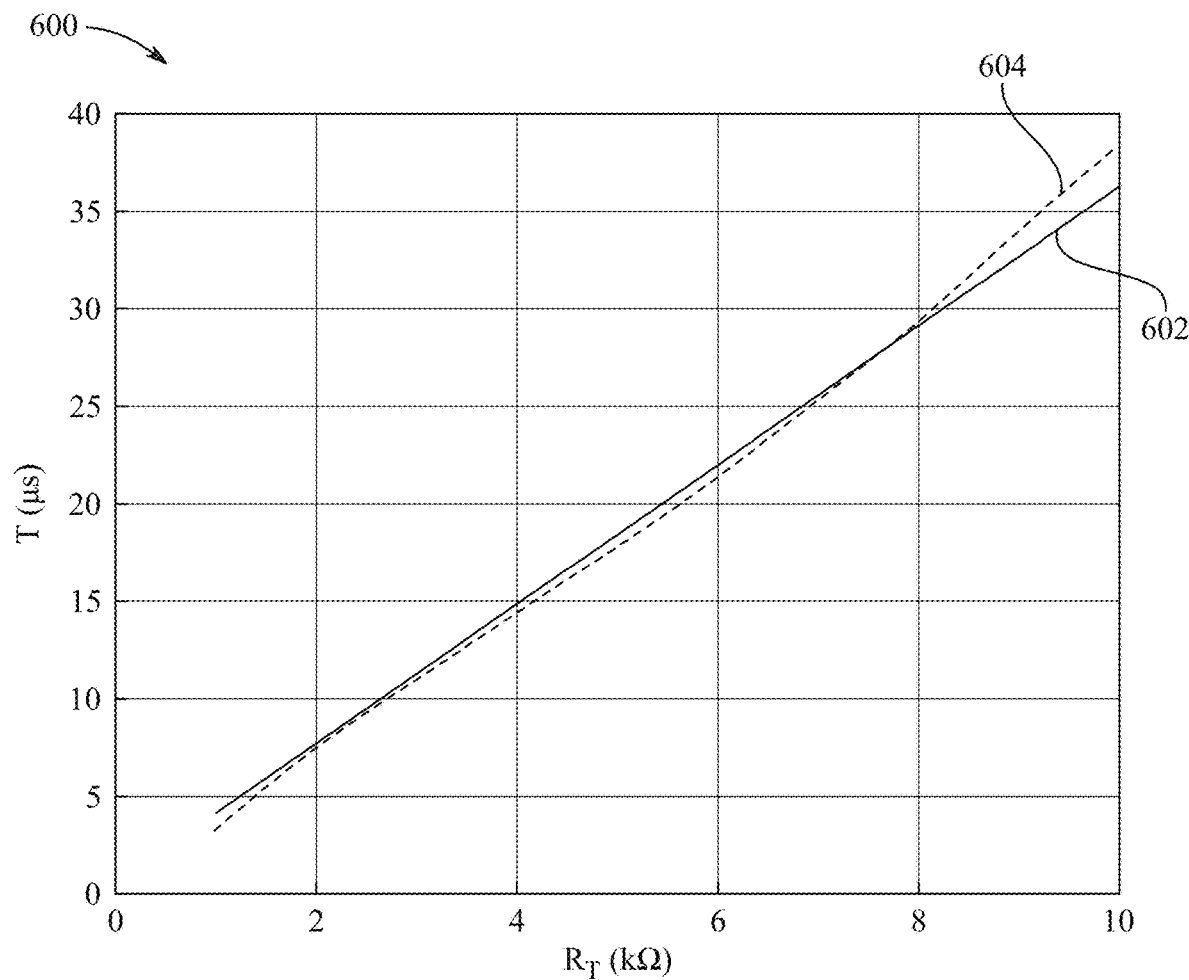
FIG. 6 illustrates a graphical representation of a period T as a function of the variable resistor $R_T$, based on both simulation results and experimental results, according to certain embodiments.

FIG. 6 illustrates a graphical representation 600 of the period T as a function of the variable resistor $R_T$ 220, based on both simulation results 602 and experimental results 604. The simulation results 602 and experimental results 604 validated the linear relationship defined in equation (15), confirming the capability of the converter 200 to accurately translate resistance values into corresponding periods. The graphical representation 600 demonstrated a close correlation between the simulation results 602 and experimental results 604 across an $R_T$ range of 1 kΩ to 8 kΩ. Minor deviations were observed in the experimental results 604 that are attributable to component tolerances inherent in physical implementation.

Figure 7:
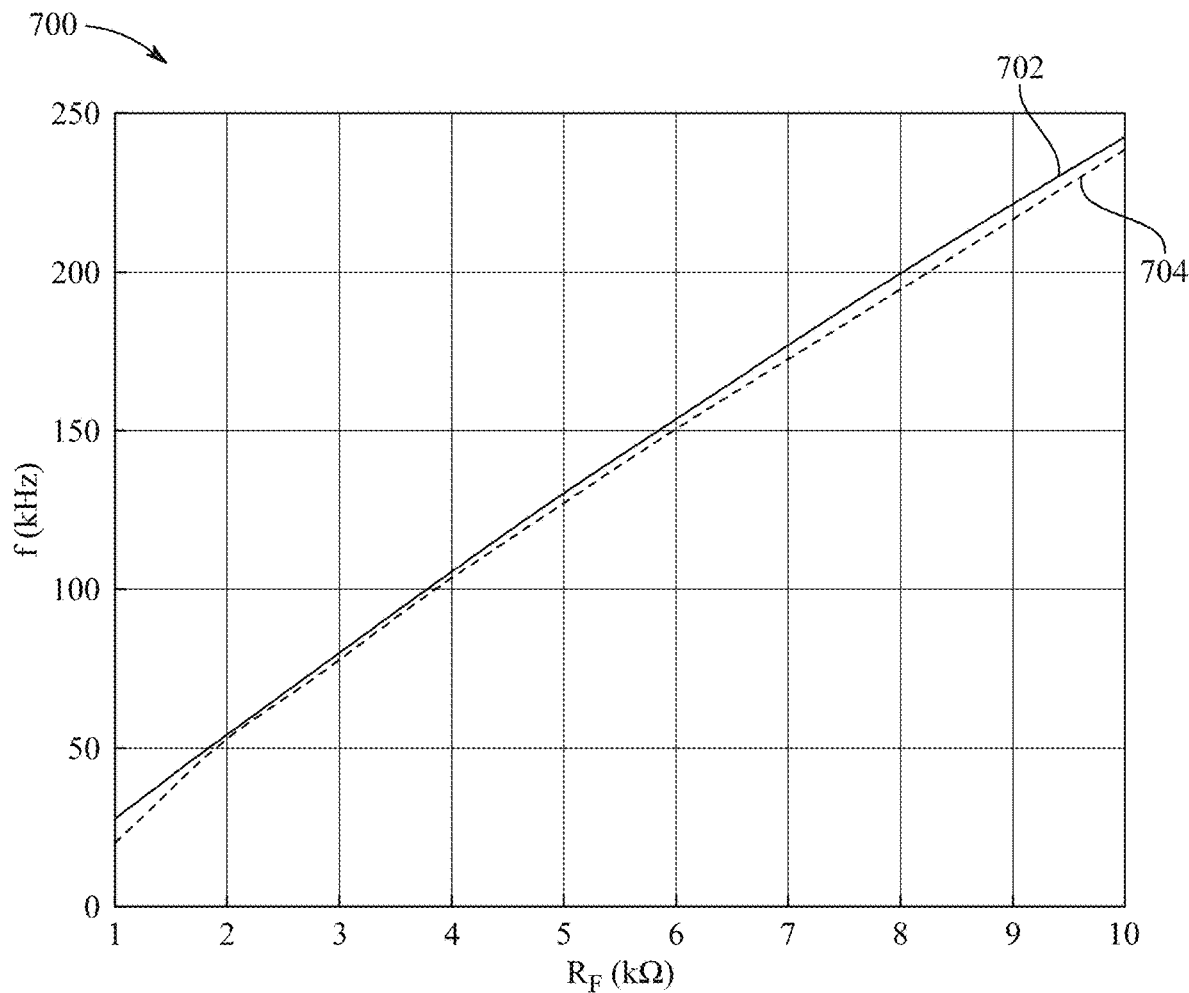
FIG. 7 illustrates a graphical representation of a frequency f as a function of the variable resistor $R_F$, based on simulation results and experimental results, according to certain embodiments.

FIG. 7 illustrates a graphical representation 700 of the frequency f as a function of the variable resistor $R_F$ 222, based on simulation results 702 and experimental results 704. This analysis was conducted to evaluate the frequency f of the converter 200 across an $R_F$ range of 1 kΩ to 10 kΩ, with the resistor $R_T$ 220 held constant. FIG. 7 demonstrates a consistent and nearly linear relationship between the frequency f and variable resistor $R_F$ 222, as defined in equation (16). A close correlation was observed between the simulation results 702 and experimental results 704, with a maximum deviation of approximately 2.5%, attributed to component tolerances encountered during physical implementation.

Tables 1A-1B present a comparative summary of the converter 200 of the present disclosure and conventional designs based on experimental results. In the comparison, designs implemented using commercially available integrated circuits were considered. Tables 1A-1B provide a comparison of key performance metrics such as supply voltage requirements, sensing range, function type (resistance-to-frequency or resistance-to-period), operating frequency or period ranges, and maximum error percentages.

As shown in FIG. 2, the converter 200, implemented using the CFOAs 202a-202c and four resistors with one capacitor, supports both resistance-to-frequency (R/F) and resistance-to-period (R/P) conversion within a single architecture. This dual-mode capability distinguishes the converter 200 of the present disclosure from conventional designs, which provided only one of these conversion functions. Furthermore, the converter 200 achieved a wide sensing range of the variable resistor $R_F$ 222 from 1 kΩ to 10 kΩ, frequency ranges from 25 kHz to 240 kHz, and a period range from 4 µs to 38 µs, while operating at ±9 V DC supply. The maximum observed error was approximately 2.5%, which remained within acceptable bounds considering standard component tolerances.

TABLE 1A

Comparative summary between the converter 200 and conventional designs

|  | Al-Absi MA | Islam, T. et al. | Hunasekattte, D. et al. | Zahangir, M. et al. | Converter 200 |
|---|---|---|---|---|---|
| Year | 2024 | 2013 | 2020 | 2017 | 2024 |
| Result | *Exp | *Exp | *Exp | *Exp | *Exp |
| Components | 741 + 8R + 1C | LF351 + TLC271 + 22R + 2C | LM741 + 8R + 1C + 1D | Opamp + 6R + 3C + 2D + NOR + XOR | CFOA + 4R + 1C |
| Voltage at drain terminal (VDD) (V) | ±5 | — | ±12 | — | ±9 |
| Sensing range | 0 Ω~10 kΩ | ±0.09 Ω | 1 kΩ~3 kΩ | — | 1 kΩ~10 kΩ |

TABLE 1A-continued

Comparative summary between the converter 200 and conventional designs

| | Al-Absi MA | Islam, T. et al. | Hunasekattte, D. et al. | Zahangir, M. et al. | Converter 200 |
|---|---|---|---|---|---|
| Functions | R/F* | R/F | R/P | R/P | R/F & R/P |
| Frequency Range (Hz) | 1 k~2.2 k | 1.17 k~7.5 k | — | — | 25 k~240 k |
| Period Range (s) | — | — | 2~7.5 | 0~10 m | 4μ~38μ |
| Max error (%) | 2.3 | — | — | — | 2.5 |

TABLE 1B

Comparative summary between the converter 200 and conventional designs

| | Anandanatarajan, R. et al. | Simic, M. | Hidalgo-Lopez et al. | Hidalgo-Lopez et al. | Converter 200 |
|---|---|---|---|---|---|
| Year | 2019 | 2022 | 2020 | 2023 | 2024 |
| Result | *Exp | *Exp | *Exp | *Exp | *Exp |
| Components | MCU + NE555 + 2R + 1C + 2D + 2SW | MCU + 1R + 1C | FPGA + 3R + 1C | FPGA + 2R + 1C | CFOA + 4R + 1C |
| VDD (V) | 5 | 5 | — | — | ±9 |
| Sensing range | 100 Ω~150 Ω | 1 kΩ~51 kΩ | 270 Ω~9 kΩ | 0.2~24.9 Ω | 1 kΩ~10 kΩ |
| Functions | R/P | R/P | R/P | R/P | R/F & R/P |
| Frequency Range (Hz) | — | — | — | — | 25 k~240 k |
| Period Range (s) | — | — | — | — | 4μ~38μ |
| Max error (%) | 0.12 | 3.2 | 0.5 | 0.8 | 2.5 |

The first embodiment is illustrated with respect to FIG. 2-FIG. 7. The first embodiment describes a resistance-to-frequency, resistance-to-time converter 200. The resistance-to-frequency, resistance-to-time converter 200 includes a first current feedback operational amplifier (CFOA) 202a having an inverting input $X_1$ 204a, a non-inverting input $Y_1$ 206a, an internal output $Z_1$ 208a, an internal output $W_1$ 210a, and an external output $V_O$ 212a. The non-inverting input $Y_1$ 206a is connected to the internal output $Z_1$ 208a. The resistance-to-frequency, resistance-to-time converter 200 further includes a second CFOA 202b having an inverting input $X_2$ 204b, a non-inverting input $Y_2$ 206b, an internal output $Z_2$ 208b, an internal output $W_2$ 210b, and an external output $V_{tr}$ 212b. The non-inverting input $Y_2$ 206b is connected to a resistor $R_2$ 214b, and to the non-inverting input $Y_1$ 206a. The inverting input $X_2$ 204b is connected to a resistor $R_3$ 214c, the internal output $Z_2$ 208b is connected to a capacitor C 216. The resistor $R_2$ 214b, the resistor $R_3$ 214c and the capacitor C 216 are connected to a ground terminal 218. The resistance-to-frequency, resistance-to-time converter 200 further includes a third CFOA 202c having an inverting input $X_3$ 204c, a non-inverting input $Y_3$ 206c, an internal output $Z_3$ 208c, an internal output $W_3$ 210c and an external output $V_1$ 212c. The external output $V_1$ 212c is connected by a resistor $R_1$ 214a to the inverting input $X_1$ 204a. The inverting input $X_3$ 204c is connected to a variable resistor $R_T$ 220. The internal output $Z_3$ 208c is connected to a variable resistor $R_F$ 222. The non-inverting input $Y_3$ 206c is connected to the external output $V_{tr}$ 212b. Each CFOA 202a-202c is voltage saturated. The external output $V_O$ 212a is a square wave with positive amplitude $V_{SAT+}$ and negative amplitude $V_{SAT-}$. The external output $V_O$ 212a has a period T proportional to a ratio of a magnitude of the variable resistor $R_T$ 220 to a magnitude of the variable resistor $R_F$ 222. The external output $V_O$ 212a has a frequency of oscillation f proportional to a ratio of the magnitude of the variable resistor $R_F$ 222 to the magnitude of the variable resistor $R_T$ 220.

In an aspect, the period T is given by:

$$T=4CR_3(1-(R_1/R_2))(R_T/R_F).$$

In an aspect, the frequency of oscillation f is given by:

$$f=(1/(4CR_3(1-(R_1/R_2))))(R_F/R_T)$$

where $R_1 < R_2$.

In an aspect, the external output $V_{tr}$ 212b is a triangular wave with:

a positive amplitude $V_{tr+}$ given by:

$$V_{tr+}=V_{SAT+}(1-(R_1/R_2))(R_T/R_F), \text{ and}$$

a negative amplitude $V_{tr-}$ given by:

$$V_{tr-}=V_{SAT-}(1-(R_1/R_2))(R_T/R_F).$$

In an aspect, the first CFOA 202a, the second CFOA 202b and the third CFOA 202c each have a positive bias input 224a or 224b or 224c connected to a positive DC voltage 228a or 228b or 228c and a negative bias input 226a or 226b or 226c connected to a negative DC voltage 230a or 230b or 230c, wherein a magnitude of the positive DC voltage 228a or 228b or 228c is equal to a magnitude of the negative DC voltage 230a or 230b or 230c.

In an aspect, each CFOA 202a-202c is biased at the positive bias input 224a or 224b or 224c by +9 volts and at the negative bias input 226a or 226b or 226c respectively by −9 volts.

In an aspect, a magnitude of resistor $R_1$ 214a is about 1 k$\Omega$, a magnitude of resistor $R_2$ 214b is about 10 k$\Omega$, a magnitude of resistor $R_3$ 214c is about 1 k$\Omega$, the magnitude of the variable resistor $R_T$ 220 is in a range of about 1 k$\Omega$ to about 5 k$\Omega$, the magnitude of the variable resistor $R_F$ 222 is in a range of about 1 k$\Omega$ to about 10 k$\Omega$ and a magnitude of the capacitor C 216 is about 10 nF.

The second embodiment is illustrated with respect to FIG. 2-FIG. 7. The second embodiment describes a method for assembling a resistance-to-frequency, resistance-to-time converter 200. The method includes connecting a non-inverting input $Y_1$ 206a to an internal output $Z_1$ 208a of a first current feedback operational amplifier (CFOA) 202a, the first CFOA 202a having an inverting input $X_1$ 204a, an internal output $W_1$ 210a and an external output $V_O$ 212a. The method further includes connecting a resistor $R_2$ 214b between a ground terminal 218 and the non-inverting input $Y_1$ 206a. The method further includes connecting the resistor $R_2$ 214b to a non-inverting input $Y_2$ 206b of a second CFOA 202b, the second CFOA 202b having an inverting input $X_2$ 204b, an internal output $Z_2$ 208b, an internal output $W_2$ 210b, and an external output $V_{tr}$ 212b. The method further includes connecting the resistor $R_2$ 214b between the ground terminal 218 and the non-inverting input $Y_2$ 206b. The method further includes connecting a resistor $R_3$ 214c between the ground terminal 218 and the inverting input $X_2$ 204b.

The method further includes connecting a capacitor C 216 between the ground terminal 218 and the internal output $Z_2$ 208b. The method further includes connecting the external output $V_{tr}$ 212b to a non-inverting input $Y_3$ 206c of a third CFOA 202c having an inverting input $X_3$ 204c, an internal output $Z_3$ 208c, an internal output $W_3$ 210c and an external output $V_1$ 212c. The method further includes connecting a resistor $R_1$ 214a between the external output $V_1$ 212c and the inverting input $X_1$ 204a. The method further includes connecting a variable resistor $R_T$ 220 between the ground terminal 218 and the inverting input $X_3$ 204c. The method further includes connecting a variable resistor $R_F$ 222 between the ground terminal 218 and the internal output $Z_3$ 208c. The method further includes connecting a positive DC voltage 228a or 228b or 228c to a positive bias terminal 224a or 224b or 224c of each CFOA 202a or 202b or 202c. The method further includes connecting a negative DC voltage 230a or 230b or 230c to a negative bias terminal 226a or 226b or 226c respectively of each CFOA 202a or 202b or 202c.

In an aspect, the method includes selecting a magnitude of the resistor $R_1$ 214a, a magnitude of the resistor $R_2$ 214b, a magnitude of the resistor $R_3$ 214c, a magnitude of the positive DC voltage 228a or 228b or 228c, a magnitude of the negative DC voltage 230a or 230b or 230c, a magnitude of the variable resistor $R_T$ 220, a magnitude of the capacitor C 216 and a magnitude of the variable resistor $R_F$ 222 to generate a square wave having a positive amplitude $V_{SAT+}$ and a negative amplitude $V_{SAT-}$ at the external output $V_O$ 212a.

In an aspect, the external output $V_{tr}$ 212b is a triangular wave having:
a positive amplitude $V_{tr+}$ given by:

$$V_{tr+}=V_{SAT+}(1-(R_1/R_2))(R_T/R_F), \text{ and}$$

a negative amplitude $V_{tr-}$ given by:

$$V_{tr-}=V_{SAT-}(1-(R_1/R_2))(R_T/R_F).$$

In an aspect, the method includes varying the magnitude of the variable resistor $R_T$ 220 and the magnitude of the variable resistor $R_F$ 222 to select a period T of the square wave.

In an aspect, the method includes setting the period T of the square wave by selecting a ratio of the magnitude of the variable resistor $R_T$ 220 to the magnitude of the variable resistor $R_F$ 222 based on:

$$T=4CR_3(1-(R_1/R_2))(R_T/R_F).$$

In an aspect, the method includes varying the magnitude of the variable resistor $R_F$ 222 and the magnitude of the variable resistor $R_T$ 220 to select a frequency of oscillation f of the square wave.

In an aspect, the method includes setting the frequency of oscillation f by selecting a ratio of the magnitude of the variable resistor $R_F$ 222 to the magnitude of the variable resistor $R_T$ 220 based on:

$$f=(1/(4CR_3(1-(R_1/R_2)))(R_F/R_T),$$

where $R_1<R_2$.

The third embodiment is illustrated with respect to FIG. 2-FIG. 7. The second embodiment describes a method of operating a resistance-to-frequency, resistance-to-time converter 200. The method includes generating a square wave having a positive amplitude $V_{SAT+}$ and a negative amplitude $V_{SAT-}$ at an external output $V_O$ 212a of a circuit. The circuit includes a first current feedback operational amplifier (CFOA) 202a having an inverting input $X_1$ 204a, a non-inverting input $Y_1$ 206a, an internal output $Z_1$ 208a, an internal output $W_1$ 210a and the external output $V_O$ 212a. The non-inverting input $Y_1$ 206a is connected to the internal output $Z_1$ 208a. The circuit further includes a second CFOA 202b having an inverting input $X_2$ 204b, a non-inverting input $Y_2$ 206b, an internal output $Z_2$ 208b, an internal output $W_2$ 210b, and an external output $V_{tr}$ 212b. The non-inverting input $Y_2$ 206b is connected to a resistor $R_2$ 214b, and to the non-inverting input $Y_1$ 206a, the inverting input $X_2$ 204b is connected to a resistor $R_3$ 214c, the internal output $Z_2$ 208b is connected to a capacitor C 216. The resistor $R_2$ 214b, the resistor $R_3$ 214c and the capacitor C 216 are connected to a ground terminal 218. The circuit further includes a third CFOA 202c having an inverting input $X_3$ 204c, a non-inverting input $Y_3$ 206c, an internal output $Z_3$ 208c, an internal output $W_3$ 210c, and an external output $V_1$ 212c. The external output $V_1$ 212c is connected by a resistor $R_1$ 214a to the inverting input $X_1$ 204a. The inverting input $X_3$ 204c is connected to a variable resistor $R_T$ 220. The internal output $Z_3$ 208c is connected to a variable resistor $R_F$ 222. The non-inverting input $Y_3$ 206c is connected to the external output $V_{tr}$ 212b. The non-inverting input $Y_3$ 206c is connected to the external output $V_{tr}$ 212b. The method further includes voltage saturating each CFOA 202a-202c. The method further includes selecting a period T of the square wave by varying a magnitude of the variable resistor $R_T$ 220 and a magnitude of the variable resistor $R_F$ 222. The method further includes selecting a frequency of oscillation f of the square wave by varying the magnitude of the variable resistor $R_F$ 222 and the magnitude of the variable resistor $R_T$ 220.

In an aspect, the method includes generating the positive amplitude $V_{SAT+}$ and the negative amplitude $V_{SAT-}$ at the external output $V_O$ 212a by selecting a magnitude of the resistor $R_1$ 214a, a magnitude of the resistor $R_2$ 214b, a magnitude of the resistor $R_3$ 214c, a magnitude of the positive DC voltage 228a or 228b or 228c, a magnitude of the negative DC voltage 230a or 230b or 230c, the magnitude of the variable resistor $R_T$ 220, a magnitude of the capacitor C 216 and the magnitude of the variable resistor $R_F$ 222, wherein:

the positive amplitude $V_{tr+}$ is given by:

$$V_{tr+}=V_{SAT+}(1-(R_1/R_2))(R_T/R_F),$$ and the negative amplitude $V_{tr-}$ is given by:

$$V_{tr-}=V_{SAT-}(1-(R_1/R_2))(R_T/R_F).$$

In an aspect, the method includes selecting a period T of the square wave by varying the magnitude of the variable resistor $R_T$ 220 and the magnitude of the variable resistor $R_F$ 222.

In an aspect, the method includes setting the period T by selecting a ratio of the magnitude of the variable resistor $R_T$ 220 to the magnitude of the variable resistor $R_F$ 222 based on:

$$T=4CR_3(1-(R_1/R_2))(R_T/R_F).$$

In an aspect, the method includes selecting a frequency of oscillation f of the square wave by varying the magnitude of the variable resistor $R_F$ 222 and the magnitude of the variable resistor $R_T$ 220.

In an aspect, the method includes setting the frequency of oscillation f by selecting a ratio of the magnitude of the variable resistor $R_F$ 222 to the magnitude of the variable resistor $R_T$ 220 based on:

$$f=(1/(4CR_3(1-(R_1/R_2))))(R_F/R_T),$$

where $R_1<R_2$.

Figure 8:
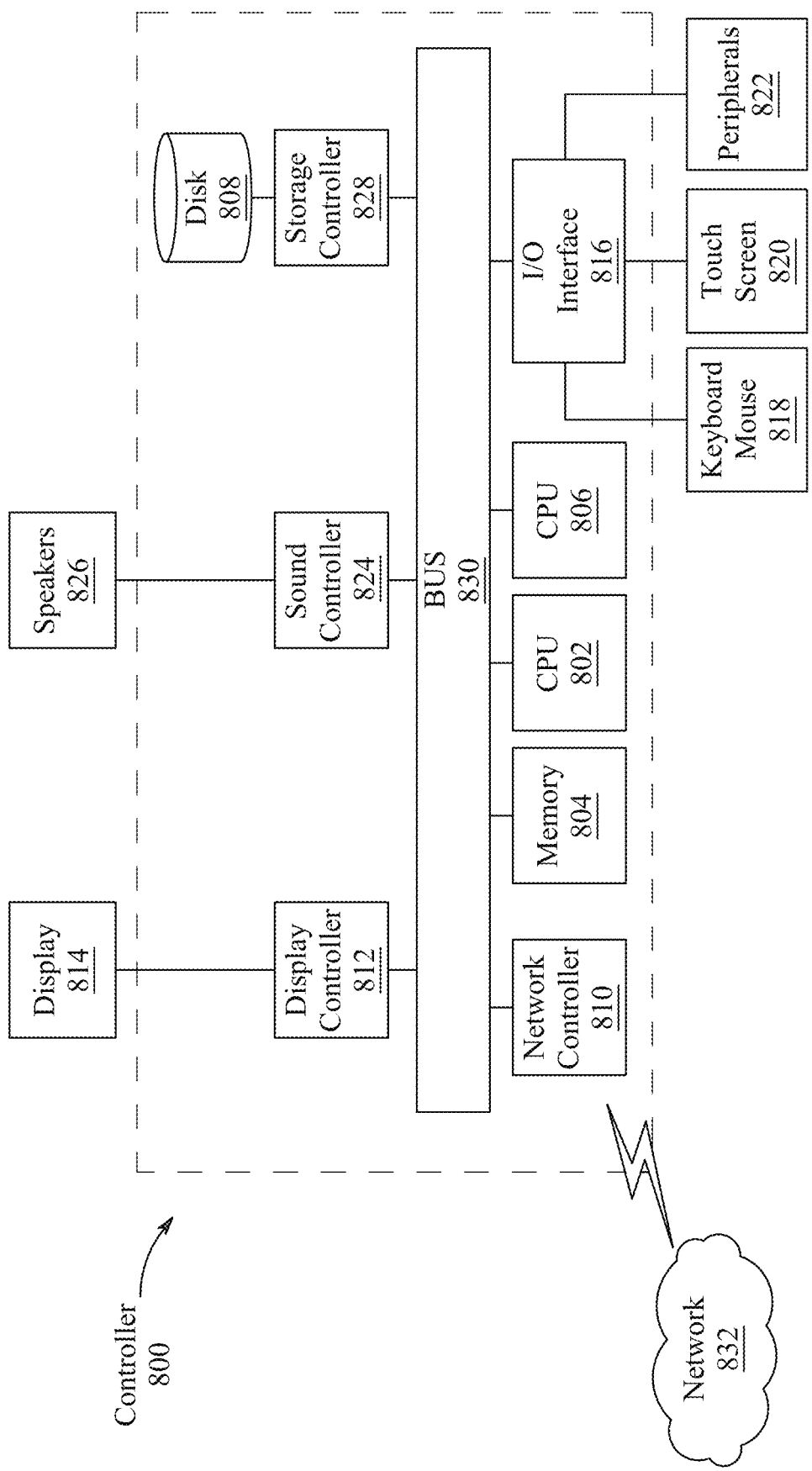
FIG. 8 is an illustration of a non-limiting example of details of computing hardware used in a computing system, according to certain embodiments.

Next, further details of the hardware description of the computing environment according to exemplary embodiments are described with reference to FIG. 8. In FIG. 8, a controller 800 includes a CPU 802 which performs the processes described above/below. The process data and instructions may be stored in memory 804. These processes and instructions may also be stored on a storage medium disk 808 such as a hard drive (HDD) or portable storage medium or may be stored remotely.

Further, the claims are not limited by the form of the computer-readable media on which the instructions of the inventive process are stored. For example, the instructions may be stored on CDs, DVDs, in FLASH memory, RAM, ROM, PROM, EPROM, EEPROM, hard disk or any other information processing device with which the computing device communicates, such as a server or computer.

Further, the claims may be provided as a utility application, background daemon, or component of an operating system, or combination thereof, executing in conjunction with CPU 802, 806 and an operating system such as Microsoft Windows 7, Microsoft Windows 10, Microsoft Windows 11, UNIX, Solaris, LINUX, Apple MAC-OS and other systems known to those skilled in the art.

The hardware elements in order to achieve the computing device may be realized by various circuitry elements, known to those skilled in the art. For example, CPU 802 or CPU 806 may be a Xenon or Core processor from Intel of America or an Opteron processor from AMD of America, or may be other processor types that would be recognized by one of ordinary skill in the art. Alternatively, the CPU 802, 806 may be implemented on an FPGA, ASIC, PLD or using discrete logic circuits, as one of ordinary skill in the art would recognize. Further, CPU 802, 806 may be implemented as multiple processors cooperatively working in parallel to perform the instructions of the inventive processes described above.

The computing device in FIG. 8 also includes a network controller 810, such as an Intel Ethernet PRO network interface card from Intel Corporation of America, for interfacing with network 832. As can be appreciated, the network 832 can be a public network, such as the Internet, or a private network, such as an LAN or WAN network, or any combination thereof and can also include PSTN or ISDN subnetworks. The network 832 can also be wired, such as an Ethernet network, or can be wireless, such as a cellular network including EDGE, 3G, 4G and 5G wireless cellular systems. The wireless network can also be WiFi, Bluetooth, or any other wireless form of communication that is known.

The computing device further includes a display controller 812, such as a NVIDIA GeForce GTX or Quadro graphics adaptor from NVIDIA Corporation of America for interfacing with display 814, such as a Hewlett Packard HPL2445w LCD monitor. A general purpose I/O interface 816 interfaces with a keyboard and/or mouse 818 as well as a touch screen panel 820 on or separate from display 814. General purpose I/O interface also connects to a variety of peripherals 822 including printers and scanners, such as an OfficeJet or DeskJet from Hewlett Packard.

A sound controller 824 is also provided in the computing device such as Sound Blaster X-Fi Titanium from Creative, to interface with speakers/microphone 826 thereby providing sounds and/or music.

The general-purpose storage controller 828 connects the storage medium disk 808 with communication bus 830, which may be an ISA, EISA, VESA, PCI, or similar, for interconnecting all of the components of the computing device. A description of the general features and functionality of the display 814, keyboard and/or mouse 818, as well as the display controller 812, storage controller 828, network controller 810, sound controller 824, and general purpose I/O interface 816 is omitted herein for brevity as these features are known.

The exemplary circuit elements described in the context of the present disclosure may be replaced with other elements and structured differently than the examples provided herein. Moreover, circuitry configured to perform features described herein may be implemented in multiple circuit units (e.g., chips), or the features may be combined in circuitry on a single chipset, as shown in FIG. 9.

Figure 9:
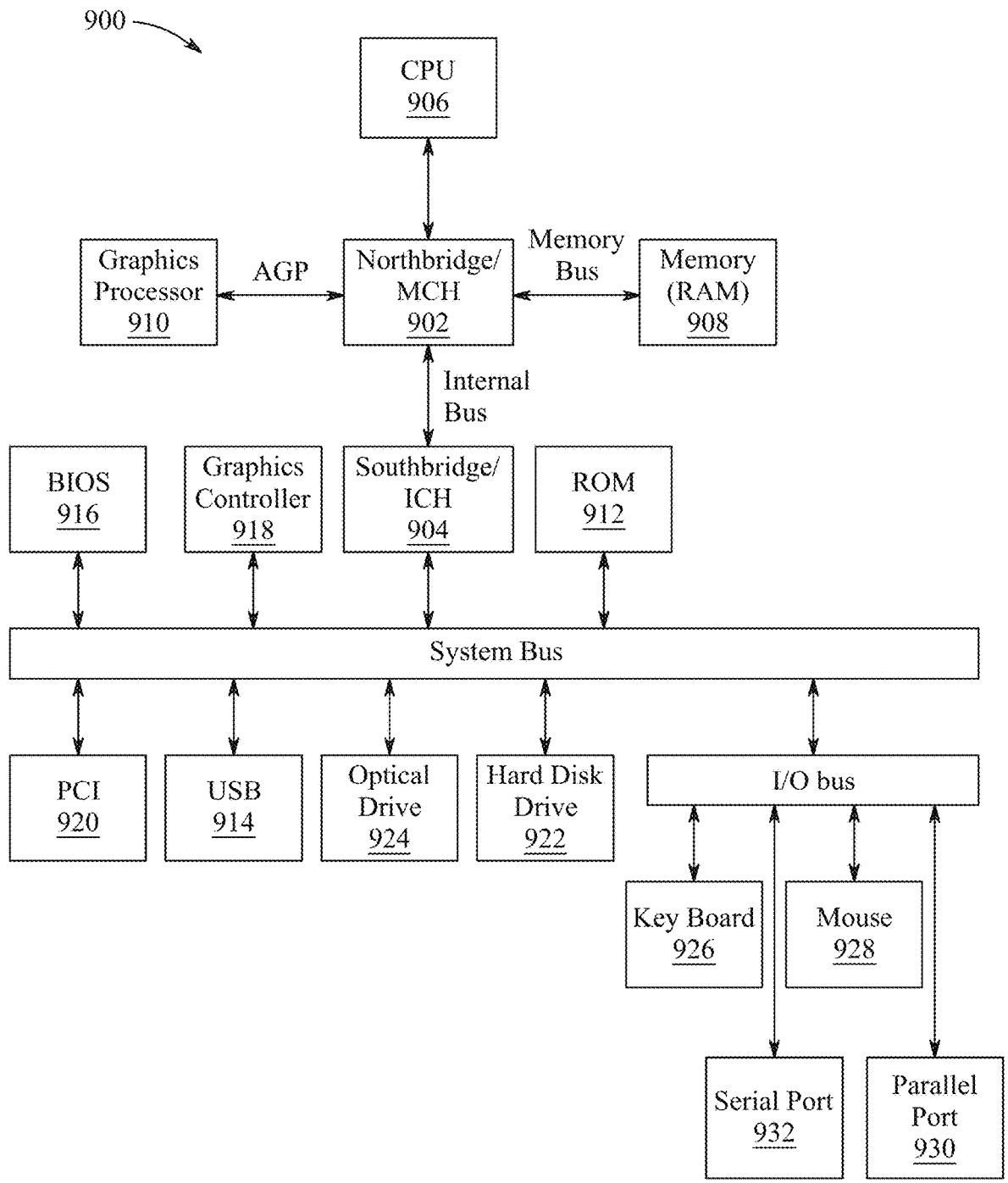
FIG. 9 is an exemplary schematic diagram of a data processing system used within the computing system, according to certain embodiments.

FIG. 9 shows a schematic diagram of a data processing system 900, according to certain embodiments, for performing the functions of the exemplary embodiments. The data processing system 900 is an example of a computer in which code or instructions implementing the processes of the illustrative embodiments may be located.

In FIG. 9, the data processing system 900 employs a hub architecture including a north bridge and memory controller hub (NB/MCH) 902 and a south bridge and input/output (I/O) controller hub (SB/ICH) 904. The central processing unit (CPU) 906 is connected to NB/MCH 902. The NB/MCH 902 also connects to the memory 908 via a memory bus and connects to the graphics processor 910 via an accelerated graphics port (AGP). The NB/MCH 902 also connects to the SB/ICH 904 via an internal bus (e.g., a unified media interface or a direct media interface). The CPU Processing unit 906 may contain one or more processors and even may be implemented using one or more heterogeneous processor systems.

Figure 10:
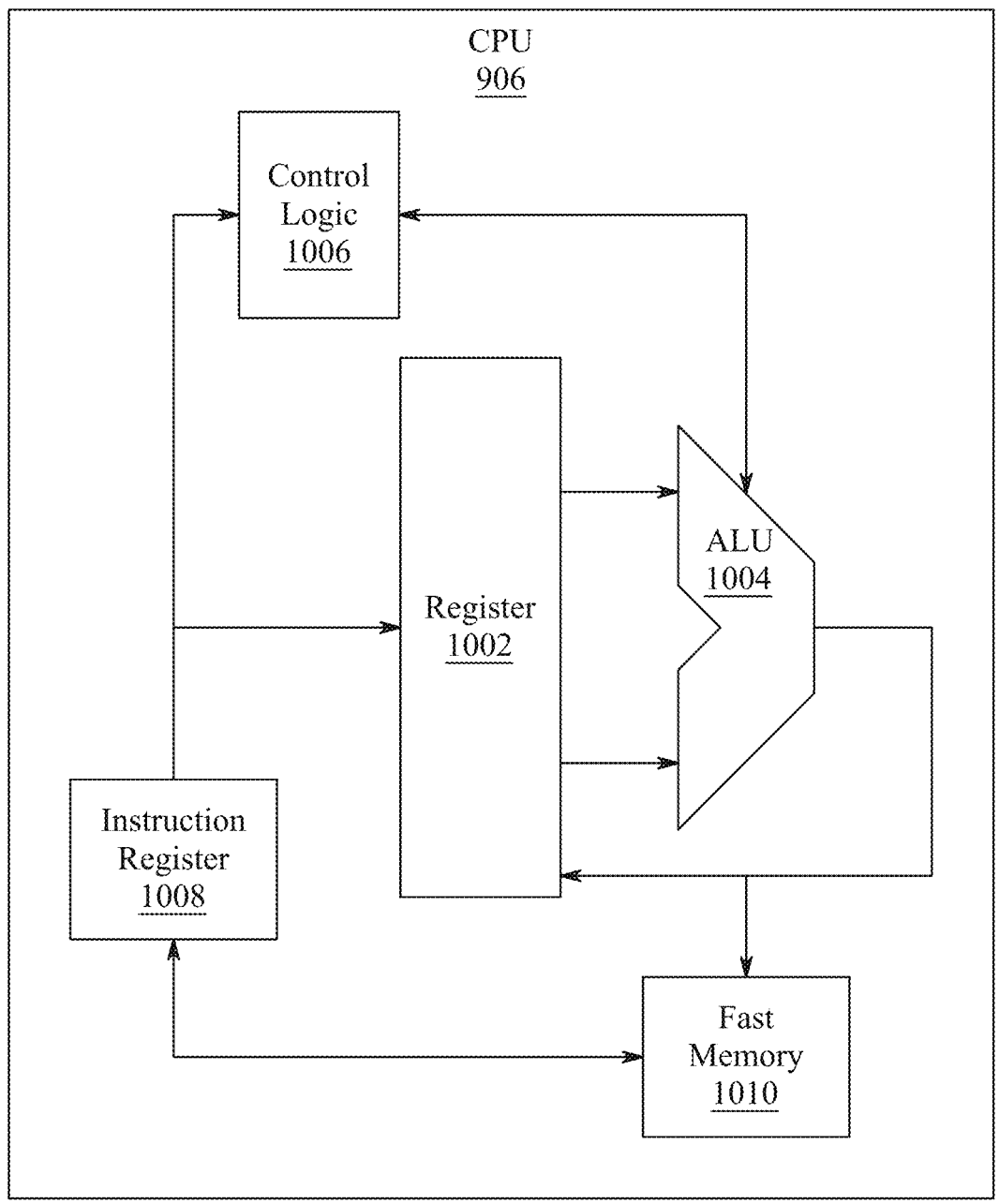
FIG. 10 is an exemplary schematic diagram of a processor used with the computing system, according to certain embodiments.

For example, FIG. 10 shows one implementation of CPU 906. In one implementation, the instruction register 1008 retrieves instructions from the fast memory 1010. At least part of these instructions is fetched from the instruction register 1008 by the control logic 1006 and interpreted according to the instruction set architecture of the CPU 906. Part of the instructions can also be directed to the register 1002. In one implementation the instructions are decoded according to a hardwired method, and in another implementation the instructions are decoded according to a microprogram that translates instructions into sets of CPU configuration signals that are applied sequentially over multiple clock pulses. After fetching and decoding the instructions, the instructions are executed using the arithmetic logic unit (ALU) 1004 that loads values from the register 1002 and performs logical and mathematical operations on the loaded values according to the instructions. The results from these operations can be feedback into the register and/or stored in the fast memory 1010. According to certain implementations, the instruction set architecture of the CPU 906 can use a reduced instruction set architecture, a complex instruction set architecture, a vector processor architecture, a very large instruction word architecture. Furthermore, the CPU 906 can be based on the Von Neuman model or the Harvard model. The CPU 906 can be a digital signal processor, an FPGA, an ASIC, a PLA, a PLD, or a CPLD. Further, the CPU 906 can be an x86 processor by Intel or by AMD; an ARM processor, a Power architecture processor by, e.g., IBM; a SPARC architecture processor by Sun Microsystems or by Oracle; or other known CPU architecture.

Referring again to FIG. 9, the data processing system 900 can include that the SB/ICH 904 is coupled through a system bus to an I/O Bus, a read only memory (ROM) 912, universal serial bus (USB) port 914, a flash binary input/output system (BIOS) 916, and a graphics controller 918. PCI/PCIe devices can also be coupled to SB/ICH 904 through a PCI bus 920.

The PCI devices may include, for example, Ethernet adapters, add-in cards, and PC cards for notebook computers. The Hard disk drive 922 and optical drive 924 can use, for example, an integrated drive electronics (IDE) or serial advanced technology attachment (SATA) interface. In one implementation the I/O bus can include a super I/O (SIO) device.

Further, the hard disk drive (HDD) 922 and optical drive 924 can also be coupled to the SB/ICH 904 through a system bus. In one implementation, a keyboard 926, a mouse 928, a parallel port 930, and a serial port 932 can be connected to the system bus through the I/O bus. Other peripherals and devices that can be connected to the SB/ICH 904 using a mass storage controller such as SATA or PATA, an Ethernet port, an ISA bus, a LPC bridge, SMBus, a DMA controller, and an Audio Codec.

Moreover, the present disclosure is not limited to the specific circuit elements described herein, nor is the present disclosure limited to the specific sizing and classification of these elements. For example, the skilled artisan will appreciate that the circuitry described herein may be adapted based on changes on battery sizing and chemistry or based on the requirements of the intended back-up load to be powered.

Figure 11:
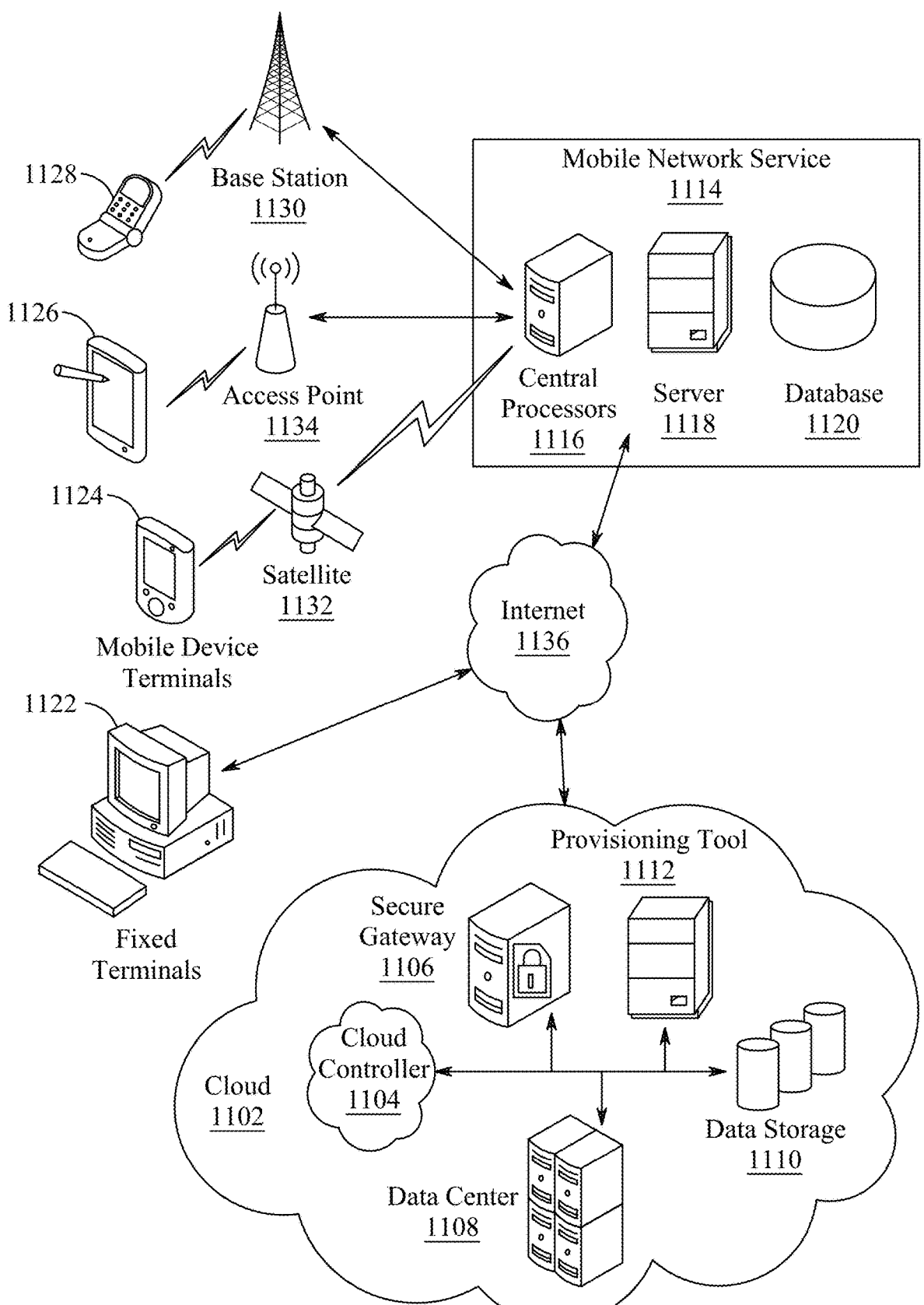
FIG. 11 is an illustration of a non-limiting example of distributed components which may share processing with a controller, according to certain embodiments.

The functions and features described herein may also be executed by various distributed components of a system. For example, one or more processors may execute these system functions, wherein the processors are distributed across multiple components communicating in a network. The distributed components may include one or more client and server machines, such as cloud 1102 including a cloud controller 1104, a secure gateway 1106, a data center 1108, data storage 1110 and a provisioning tool 1112, and mobile network services 1114 including central processors 1116, a server 1118 and a database 1120, which may share processing, as shown by FIG. 11, in addition to various human interface and communication devices (e.g., display monitors 1122, smart phones 1128, tablets 1126, personal digital assistants (PDAs) 1124). The network may be a private network, such as a LAN, satellite 1132 or WAN 1134, or be a public network 1130, may such as the Internet 1136. Input to the system may be received via direct user input and received remotely either in real-time or as a batch process. Additionally, some implementations may be performed on modules or hardware not identical to those described. Accordingly, other implementations are within the scope that may be claimed.

The above-described hardware description is a non-limiting example of corresponding structure for performing the functionality described herein.

Numerous modifications and variations of the present disclosure are possible in light of the above teachings. It is therefore to be understood that within the scope of the appended claims, the invention may be practiced otherwise than as specifically described herein.

The invention claimed is:

1. A resistance-to-frequency, resistance-to-time converter, comprising:

a first current feedback operational amplifier (CFOA) having an inverting input $X_1$, a non-inverting input $Y_1$, an internal output $Z_1$, an internal output $W_1$ and an external output $V_0$, wherein the non-inverting input $Y_1$ is connected to the internal output $Z_1$;

a second CFOA having an inverting input $X_2$, a non-inverting input $Y_2$, an internal output $Z_2$, an internal output $W_2$ and an external output $V_{tr}$, wherein the non-inverting input $Y_2$ is connected to a resistor $R_2$ and to the non-inverting input $Y_1$, the inverting input $X_2$ is connected to a resistor $R_3$, the internal output $Z_2$ is connected to a capacitor C, wherein the resistor $R_2$, the resistor $R_3$ and the capacitor C are connected to a ground terminal; and a third CFOA having an inverting input $X_3$, a non-inverting input $Y_3$, an internal output $Z_3$, an internal output $W_3$ and an external output $V_1$, wherein the external output $V_1$ is connected by a resistor $R_1$ to the inverting input $X_1$, wherein the inverting input $X_3$ is connected to a variable resistor $R_T$, wherein the internal output $Z_3$ is connected to a variable resistor $R_F$, wherein the non-inverting input $Y_3$ is connected to the external output $V_{tr}$, wherein:

each CFOA is voltage saturated, the external output $V_0$ is a square wave with positive amplitude $V_{SAT+}$ and negative amplitude $V_{SAT-}$, the external output $V_0$ has a period T proportional to a ratio of a magnitude of the variable resistor $R_T$ to a magnitude of the variable resistor $R_F$, and the external output $V_0$ has a frequency of oscillation f proportional to a ratio of the magnitude of the variable resistor $R_F$ to the magnitude of the variable resistor $R_T$.

2. The resistance-to-frequency, resistance-to-time converter of claim 1, wherein the period T is given by:

$$T=4CR_3(1-(R_1/R_2))(R_T/R_F).$$

3. The resistance-to-frequency, resistance-to-time converter of claim 1, wherein the frequency of oscillation f is given by:

$$f=(1/(4CR_3(1-(R_1/R_2))))(R_F/R_T)$$

where $R_1<R_2$.

4. The resistance-to-frequency, resistance-to-time converter of claim 1, wherein the external output $V_{tr}$ is a triangular wave with:
a positive amplitude $V_{tr+}$ given by:

$$V_{tr+}=V_{SAT+}(1-(R_1/R_2))(R_T/R_F), \text{ and}$$

a negative amplitude $V_{tr-}$ given by:

$$V_{tr-}=V_{SAT-}(1-(R_1/R_2))(R_T/R_F).$$

5. The resistance-to-frequency, resistance-to-time converter of claim 1, wherein:
the first CFOA, the second CFOA and the third CFOA each have a positive bias input connected to a positive DC voltage and a negative bias input connected to a negative DC voltage, wherein a magnitude of the positive DC voltage is equal to a magnitude of the negative DC voltage.

6. The resistance-to-frequency, resistance-to-time converter of claim 5, wherein each CFOA is biased at the positive bias input by +9 volts and at the negative bias input by −9 volts.

7. The resistance-to-frequency, resistance-to-time converter of claim 1, wherein:
a magnitude of resistor $R_1$ is about 1 kΩ, a magnitude of resistor $R_2$ is about 10 kΩ, a magnitude of resistor $R_3$ is about 1 kΩ, the magnitude of the variable resistor $R_T$ is in a range of about 1 kΩ to about 5 kΩ, the magnitude of the variable resistor $R_F$ is in a range of about 1 kΩ to about 10 kΩ and a magnitude of the capacitor C is about 10 nF.

8. A method for assembling a resistance-to-frequency, resistance-to-time converter, comprising:
connecting a non-inverting input $Y_1$ to an internal output $Z_1$ of a first current feedback operational amplifier (CFOA), the first CFOA having an inverting input $X_1$, an internal output $W_1$ and an external output $V_0$;
connecting a resistor $R_2$ between a ground terminal and the non-inverting input $Y_1$;
connecting the resistor $R_2$ to a non-inverting input $Y_2$ of a second CFOA, the second CFOA having an inverting input $X_2$, an internal output $Z_2$, an internal output $W_2$ and an external output $V_{tr}$;
connecting the resistor $R_2$ between the ground terminal and the non-inverting input $Y_2$;
connecting a resistor $R_3$ between the ground terminal and the inverting input $X_2$;
connecting a capacitor C between the ground terminal and the internal output $Z_2$;
connecting the external output $V_{tr}$ to a non-inverting input $Y_3$ of a third CFOA having an inverting input $X_3$, an internal output $Z_3$, an internal output $W_3$ and an external output $V_1$;
connecting a resistor $R_1$ between the external output $V_1$ and the inverting input $X_1$,
connecting a variable resistor $R_T$ between the ground terminal and the inverting input $X_3$;
connecting a variable resistor $R_F$ between the ground terminal and the internal output $Z_3$;
connecting a positive DC voltage to a positive bias terminal of each CFOA; and
connecting a negative DC voltage to a negative bias terminal of each CFOA.

9. The method of claim 8, further comprising:
selecting a magnitude of the resistor $R_1$, a magnitude of the resistor $R_2$, a magnitude of the resistor $R_3$, a magnitude of the positive DC voltage, a magnitude of the negative DC voltage, a magnitude of the variable resistor $R_T$, a magnitude of the capacitor C and a magnitude of the variable resistor $R_F$ to generate a square wave having a positive amplitude $V_{SAT+}$ and a negative amplitude $V_{SAT-}$ at the external output $V_0$.

10. The method of claim 9, wherein the external output $V_{tr}$ is a triangular wave having:
a positive amplitude $V_{tr+}$ given by:

$$V_{tr+}=V_{SAT+}(1-(R_1/R_2))(R_T/R_F), \text{ and}$$

a negative amplitude $V_{tr-}$ given by:

$$V_{tr-}=V_{SAT-}(1-(R_1/R_2))(R_T/R_F).$$

11. The method of claim 9, further comprising:
varying the magnitude of the variable resistor $R_T$ and the magnitude of the variable resistor $R_F$ to select a period T of the square wave.

12. The method of claim 11, further comprising:
setting the period T of the square wave by selecting a ratio of the magnitude of the variable resistor $R_T$ to the magnitude of the variable resistor $R_F$ based on:

$$T=4CR_3(1-(R_1/R_2))(R_T/R_F).$$

13. The method of claim 9, further comprising:
varying the magnitude of the variable resistor $R_F$ and the magnitude of the variable resistor $R_T$ to select a frequency of oscillation f of the square wave.

14. The method of claim 13, further comprising:
setting the frequency of oscillation f by selecting a ratio of the magnitude of the variable resistor $R_F$ to the magnitude of the variable resistor $R_T$ based on:

$$f=(1/(4CR_3(1-(R_1/R_2))))(R_F/R_T),$$

where $R_1<R_2$.

15. The method of operating a resistance-to-frequency, resistance-to-time converter, comprising:
generating a square wave having a positive amplitude $V_{SAT+}$ and a negative amplitude $V_{SAT-}$ at an external output $V_0$ of a circuit comprising:
a first current feedback operational amplifier (CFOA) having an inverting input $X_1$, a non-inverting input $Y_1$, an internal output $Z_1$, an internal output $W_1$ and the external output $V_0$, wherein the non-inverting input $Y_1$ is connected to the internal output $Z_1$;
a second CFOA having an inverting input $X_2$, a non-inverting input $Y_2$, an internal output $Z_2$, an internal output $W_2$ and an external output $V_{tr}$, wherein the non-inverting input $Y_2$ is connected to a resistor $R_2$ and to the non-inverting input $Y_1$, the inverting input $X_2$ is connected to a resistor $R_3$, the internal output $Z_2$ is connected to a capacitor C, wherein the resistor $R_2$, the resistor $R_3$ and the capacitor C are connected to a ground terminal; and
a third CFOA having an inverting input $X_3$, a non-inverting input $Y_3$, an internal output $Z_3$, an internal output $W_3$ and an external output $V_1$, wherein the external output $V_1$ is connected by a resistor $R_1$ to the inverting input $X_1$, wherein the inverting input $X_3$ is connected to a variable resistor $R_T$, wherein the internal output $Z_3$ is connected to a variable resistor $R_F$, wherein the non-inverting input $Y_3$ is connected to the external output $V_{tr}$, wherein the non-inverting input $Y_3$ is connected to the external output $V_{tr}$, voltage saturating each CFOA;

selecting a period T of the square wave by varying a magnitude of the variable resistor $R_T$ and a magnitude of the variable resistor $R_F$; and selecting a frequency of oscillation f of the square wave by varying the magnitude of the variable resistor $R_F$ and the magnitude of the variable resistor $R_T$.

16. The method of claim 15, further comprising:

generating the positive amplitude $V_{SAT+}$ and the negative amplitude $V_{SAT-}$ at the external output $V_0$ by selecting a magnitude of the resistor $R_1$, a magnitude of the resistor $R_2$, a magnitude of the resistor $R_3$, a magnitude of a positive DC voltage, a magnitude of a negative DC voltage, a magnitude of the capacitor C, the magnitude of the variable resistor $R_T$ and the magnitude of the variable resistor $R_F$, wherein:

the positive amplitude $V_{tr+}$ is given by:

$$V_{tr+}=V_{SAT+}(1-(R_1/R_2))(R_T/R_F), \text{ and}$$

the negative amplitude $V_{tr-}$ is given by:

$$V_{tr-}=V_{SAT-}(1-(R_1/R_2))(R_T/R_F).$$

17. The method of claim 16, further comprising:

selecting a period T of the square wave by varying the magnitude of the variable resistor $R_T$ and the magnitude of the variable resistor $R_F$.

18. The method of claim 17, further comprising:

setting the period T by selecting a ratio of the magnitude of the variable resistor $R_T$ to the magnitude of the variable resistor $R_F$ based on:

$$T=4CR_3(1-(R_1/R_2))(R_T/R_F).$$

19. The method of claim 16, further comprising:

selecting a frequency of oscillation f of the square wave by varying the magnitude of the variable resistor $R_F$ and the magnitude of the variable resistor $R_T$.

20. The method of claim 17, further comprising:

setting the frequency of oscillation f by selecting a ratio of the magnitude of the variable resistor $R_F$ to the magnitude of the variable resistor $R_T$ based on:

$$f=(1/(4CR_3(1-(R_1/R_2))) (R_F/R_T),$$

where $R_1<R_2$.

* * * * *